(12) United States Patent
Lee et al.

(10) Patent No.: US 8,455,301 B2
(45) Date of Patent: Jun. 4, 2013

(54) METHOD OF FABRICATING STACKED CHIPS IN A SEMICONDUCTOR PACKAGE

(75) Inventors: Teak-hoon Lee, Hwaseong-si (KR); Won-keun Kim, Hwaseong-si (KR); Dong-hyeon Jang, Yongin-si (KR); Ho-geon Song, Suwon-si (KR); Sung-jun Im, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 75 days.

(21) Appl. No.: 13/243,493

(22) Filed: Sep. 23, 2011

(65) Prior Publication Data
US 2012/0088332 A1   Apr. 12, 2012

(30) Foreign Application Priority Data
Oct. 6, 2010   (KR) .................. 10-2010-0097415

(51) Int. Cl.
*H01L 21/00*   (2006.01)
*H01L 29/06*   (2006.01)

(52) U.S. Cl.
USPC ........... 438/109; 438/113; 438/126; 438/458; 438/462; 257/622; 257/686; 257/777; 257/E25.006; 257/E25.013

(58) Field of Classification Search
None
See application file for complete search history.

(56) References Cited

U.S. PATENT DOCUMENTS

| | | | | |
|---|---|---|---|---|
| 7,531,441 | B2 * | 5/2009 | Kado et al. | 438/612 |
| 8,110,441 | B2 * | 2/2012 | Chandra et al. | 438/113 |
| 8,278,147 | B2 * | 10/2012 | Kado et al. | 438/110 |
| 2010/0258932 | A1 * | 10/2010 | Yoshida et al. | 257/686 |

FOREIGN PATENT DOCUMENTS

| | | |
|---|---|---|
| JP | 2007-214220 | 8/2007 |
| JP | 2007-234881 | 9/2007 |
| JP | 2008-227348 | 9/2008 |

* cited by examiner

*Primary Examiner* — Alonzo Chambliss
(74) *Attorney, Agent, or Firm* — Myers Bigel Sibley & Sajovec, P.A.

(57) ABSTRACT

A method of forming a semiconductor package includes attaching a semiconductor substrate on a support substrate, wherein the semiconductor substrate includes a plurality of first semiconductor chips and a chip cutting region that separates respective ones of the semiconductor chips. A first cutting groove is formed that has a first kerf width between first and second ones of the plurality of first semiconductor chips. A plurality of second semiconductor chips is attached to the plurality of first semiconductor chips. A molding layer is formed so as to fill the first cutting groove and a second cutting groove having a second kerf width that is less than the first kerf width is formed in the molding layer so as to form individual molding layers covering one of the plurality of first semiconductor chips and one of the plurality of second semiconductor chips.

26 Claims, 27 Drawing Sheets

METHOD OF FABRICATING STACKED CHIPS IN A SEMICONDUCTOR PACKAGE

CROSS-REFERENCE TO RELATED APPLICATIONS

This application claims the benefit of Korean Patent Application No. 10-2010-0097415, filed on Oct. 6, 2010, in the Korean Intellectual Property Office, the disclosure of which is incorporated herein in its entirety by reference.

BACKGROUND

The inventive concept relates to a semiconductor device, and, more particularly, to a stack semiconductor package and a method of manufacturing the stack semiconductor package.

Due to recent developments in the semiconductor industries and demand by users, electronic devices increasingly have large capacities, and, thus, semiconductor devices, which are the core components of the electronic devices may also need to be highly integrated. However, it may be difficult to reduce the design rule for the high integration degree of semiconductor devices.

SUMMARY

The inventive concept provides a semiconductor package having a large capacity and minimized volume, and a method of manufacturing the semiconductor package.

According to an aspect of the inventive concept, there is provided a method of manufacturing a semiconductor package, the method comprising: attaching a semiconductor substrate on a support substrate using an adhesive layer, wherein the semiconductor substrate includes a plurality of first semiconductor chips and a chip cutting region, wherein first and second ones of the plurality of first semiconductor chips are separated each other by the chip cutting region, and the semiconductor substrate includes a first surface on which an active area is formed and a second surface opposite to the first surface; forming a first cutting groove having a first kerf width, in the chip cutting region between the first and second ones of the plurality of first semiconductor chips, so that the semiconductor substrate is separated into a plurality of first semiconductor chips; attaching a plurality of second semiconductor chips corresponding to the first semiconductor chips, respectively, to the plurality of first semiconductor chips; forming a molding layer so as to fill the first cutting groove; and forming a second cutting groove having a second kerf width that is less than the first kerf width, in the molding layer, so as to separate the molding layer into individual molding layers covering one of the plurality of first semiconductor chips and corresponding one of the plurality of second semiconductor chips.

The forming of the first cutting groove comprises removing a portion of the chip cutting region and a portion of the adhesive layer.

In the forming of the second cutting groove, a portion of the molding layer, which is formed where a portion of the adhesive is removed, may be separated by the second cutting groove so as to form a protrusion protruding with respect to the first surface of the semiconductor substrate facing the support substrate.

The plurality of first semiconductor chips may include a plurality of first through electrodes, respectively.

In the attaching of the semiconductor substrate on the support substrate on which the adhesive layer is formed, the first surface of the semiconductor substrate may be formed to contact the adhesive layer.

The method may further comprise, after attaching the semiconductor substrate on the support substrate, exposing the plurality of first through electrodes by removing a portion of the semiconductor substrate from the second surface of the semiconductor substrate.

The plurality of first semiconductor chips may further comprise a plurality of first connection bumps that are respectively electrically connected to the plurality of first through electrodes, wherein the attaching of the semiconductor substrate on the support substrate, on which the adhesive layer is formed, may comprise forming the plurality of first connection bumps so as to be surrounded by the adhesive layer.

A semiconductor device formed in the second semiconductor chips may be electrically connected to at least some of the plurality of first connection bumps via at least some of the plurality of first through electrodes.

The second semiconductor chips may further comprise a plurality of second connection bumps respectively corresponding to at least some of the plurality of first through electrodes, and in the attaching of the second semiconductor chips, the plurality of second connection bumps may be formed to contact the corresponding first through electrodes.

The plurality of first connection bumps may be attached on the first surface of the first semiconductor chips.

The plurality of first connection bumps may be attached on the second surface of the first semiconductor chips.

The plurality of first through electrodes may electrically connect a semiconductor device formed in the first semiconductor chip or the second semiconductor chip to the plurality of first connection bumps.

Thicknesses of the plurality of first connection bumps may be less than a thickness of the adhesive layer.

A depth of a removed portion of the adhesive layer in the first cutting groove may be less than a thickness of the first connection bumps.

The forming of the molding layer may comprise completely covering the plurality of first and second semiconductor chips using the molding layer.

The forming of the molding layer may comprise completely surrounding the plurality of second semiconductor chips using the molding layer.

The method may further comprise, before the forming of the molding layer, performing a test for the first semiconductor chips and the second semiconductor chips corresponding to the first semiconductor chips.

In the attaching of the semiconductor substrate on the support substrate, on which the adhesive layer is formed, the second surface may be formed to contact the adhesive layer.

In the forming of the second cutting groove, a remaining portion of the molding layer after forming the second cutting groove may be formed to completely cover sidewalls of the first cutting groove.

In the forming of the second cutting groove, the second cutting groove may be formed passing through the molding layer.

The plurality of second semiconductor chips may be attached to the first semiconductor chips.

At least some of the plurality of second semiconductor chips may include a plurality of second through electrodes.

According to another aspect of the inventive concept, there is provided a method of manufacturing a semiconductor package, the method comprising: attaching a first semiconductor substrate onto a support substrate using an adhesive layer, wherein the first semiconductor substrate includes a plurality of first semiconductor chips and a first chip cutting region, wherein first and second ones of the plurality of first semiconductor chips are separated from each other by the first chip cutting region, wherein the plurality of first semiconductor chips respectively including a plurality of first through electrodes; attaching a second semiconductor substrate on the first semiconductor substrate, wherein the second semiconductor substrate includes a plurality of second semiconductor chips and a second chip cutting region, wherein first and second ones of the plurality of second semiconductor chips are separated from each other by the second chip cutting region, wherein a plurality of second semiconductor chips respectively include a plurality of second through electrodes; forming a first cutting groove having a first kerf width, in the first chip cutting region of the first semiconductor substrate and in the second chip cutting region of the second semiconductor substrate so as to respectively separate the first and second semiconductor substrates into the first and second semiconductor chips; forming a molding layer to fill the first cutting groove; and forming a second cutting groove having a second kerf width that is less than the first kerf width, in the molding layer so as to separate the molding layer into individual molding layers covering one of the plurality of first semiconductor chips and a corresponding one of the plurality of second semiconductor chips.

In the forming of the first cutting groove, a portion of the first chip cutting region, a portion of the second chip cutting region, and a portion of the adhesive layer may be removed together.

The first semiconductor chips and the second semiconductor chips may be homogeneous semiconductor chips.

The method may further comprise, after the forming of the second cutting groove, separating the adhesive layer and the support substrate from the plurality of first semiconductor chips.

According to another aspect of the inventive concept, there is provided a semiconductor package comprising: a first semiconductor chip having a first surface and a second surface opposite to the first surface, wherein a plurality of through electrodes passing through the first surface and the second surface are formed in the first semiconductor chip; at least one second semiconductor chip stacked on the second surface of the first semiconductor chip; a plurality of first connection bumps that are attached on the first surface of the first semiconductor chip and electrically connected to the first semiconductor chip or the at least one second semiconductor chip; and a molding layer covering the first semiconductor chip and the at least one second semiconductor chip, wherein the molding layer comprises a protrusion extended so as to protrude from the first surface of the first semiconductor chip.

The protrusion may be continuously extended along the boundary of the first surface.

A height of the protrusion protruding from the first surface may be less than a height of the first connection bumps.

The first surface may be an active surface of the first semiconductor chip. Alternatively, the second surface may be an active surface of the first semiconductor chip.

The at least one second semiconductor chip may be attached to the first semiconductor chip such that an active surface of the at least one second semiconductor chip faces the first semiconductor chip.

A surface area of the at least one second semiconductor chip may be less than a surface area of the first semiconductor chip.

The first semiconductor chip and the at least one second semiconductor chip may be homogeneous semiconductor chips, and a surface area of a scribe lane remaining in the first semiconductor chip is greater than a surface area of a scribe lane remaining in the at least one second semiconductor chip.

The first semiconductor chip and the at least one second semiconductor chip may be homogeneous semiconductor chips, and a surface area of a scribe lane remaining in the first semiconductor chip may be the same as a surface area of a scribe lane remaining in the at least one second semiconductor chip.

A plurality of second semiconductor chips may be included, and surface areas of the plurality of second semiconductor chips may be equal to or less than a surface area of the first semiconductor chip.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
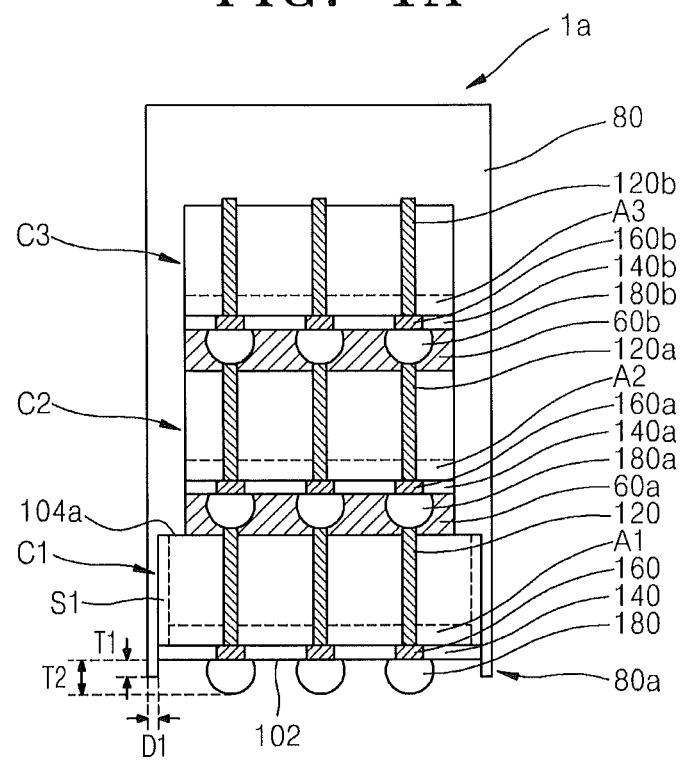
FIGS. 1A and 1B and 2 through 7 are cross-sectional views and a bottom view of semiconductor packages according to embodiments of the inventive concept.

The inventive concept will now be described more fully with reference to the accompanying drawings, in which exemplary embodiments of the inventive concept are shown. The inventive concept may, however, be embodied in many different forms by one of ordinary skill in the art without departing from the technical teaching of the inventive concept. In other words, particular structural and functional description of the inventive concept are provided in descriptive sense only; various changes in form and details may be made therein and thus should not be construed as being limited to the embodiments set forth herein. As the inventive concept is not limited to the embodiments described in the present description, and thus it should not be understood that the inventive concept includes every kind of variation examples or alternative equivalents included in the spirit and scope of the inventive concept.

It will be understood that when an element is referred to as being "connected to", or "contacting" another element throughout the specification, it can be directly "connected to" or "contacting" the other element, or intervening elements may also be present. On the other hand, when a component is referred to as being "directly connected to" or "directly contacting" another element, it will be understood that no intervening element is present. Other words used to describe the relationship between elements should be interpreted in a like fashion (e.g., "between," versus "directly between," "adjacent," versus "directly adjacent," etc.).

In the present description, terms such as 'first', 'second', etc. are used to describe various elements. However, it is obvious that the elements should not be defined by these terms. The terms are used only for distinguishing one element from another element. For example, a first element which could be termed a second element, and similarly, a second element may be termed a first element, without departing from the teaching of the inventive concept.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification.

Like reference numerals in the drawings denote like elements or corresponding elements that are replaceable within the scope of the technical spirit of the inventive concept.

FIGS. 1A and 1B and 2 through 7 are cross-sectional views and a bottom view of semiconductor packages 1a, 1b, 1c, 1d, 1e, 1f, and 1g according to embodiments of the inventive concept.

FIG. 1A is a cross-sectional view illustrating the semiconductor package 1a according to an embodiment of the inventive concept.

Referring to FIG. 1A, the semiconductor package 1a includes a plurality of semiconductor chips, namely, first, second, and third semiconductor chips C1, C2, and C3. The semiconductor package 1a illustrated in FIG. 1A includes three semiconductor chips, but may also include two or more semiconductor chips. According to the current embodiment, the third semiconductor chip C3 will be referred to as a semiconductor chip that is stacked farthest from the first semiconductor chip C1. That is, when the first semiconductor chip C1 refers to the lowermost semiconductor chip, the third semiconductor chip C3 refers to the uppermost semiconductor chip. Consequently, if the semiconductor package 1a includes two semiconductor chips, then just the first semiconductor chip C1 and the third semiconductor chip C3 are included, and the following description may be this case.

The first semiconductor chip C1 includes at least one first through electrode 120. The second and third semiconductor chips C2 and C3 may include at least one second through electrode 120a and at least one third through electrode 120b, respectively.

The first semiconductor chip C1 may be formed by forming an individual semiconductor device including a transistor, a resistor, a capacitor, or a conductive wiring, or the like, on a semiconductor substrate, and then separating the semiconductor substrate into chips. The semiconductor substrate may be formed of a typical semiconductor substrate having a planar upper surface, such as a silicon substrate. Alternatively, the semiconductor substrate may be formed of a compound semiconductor substrate, such as a silicon on insulator (SOI) substrate, a silicon-germanium substrate, a silicon carbide substrate or a gallium-arsenic substrate.

To form the first semiconductor chip C1, the semiconductor substrate may be cut along a scribe lane formed on the semiconductor substrate. Accordingly, a first remaining scribe lane region S1 remaining when cutting the semiconductor substrate along the scribe lane may be included around the first semiconductor chip C1.

Hereinafter, a "semiconductor chip" will refer to pieces of a semiconductor wafer, to which a semiconductor process has been conducted, formed by separating the semiconductor wafer into individual dies; that is, a "semiconductor chip" refers to an individual semiconductor device. Hereinafter, a "scribe lane" refers to a region between individual dies on the semiconductor wafer, meaning regions where individual semiconductor devices are not formed or where test patterns or semiconductor devices for a test are formed on the wafer level or where dummy patterns for process stability are formed. The "scribe lane" is removed when the semiconductor wafer is separated into individual dies, but a portion of the scribe lane adjacent to the individual dies may remain to prevent defects of individual dies, that is, semiconductor chips.

The first semiconductor chip C1 may include a first surface 102 and a second surface 104a opposite to the first surface 102. The first surface 102 is where an active area A1 in which the individual semiconductor devices are formed is formed; the first surface 102 may also be referred to as a first active surface 102.

A first protection layer 140 and a conductive first pad 160 may be formed on the first surface 102 of the first semiconductor chip C1. Also, a plurality of first connection bumps 180 may be attached to each first pad 160 so as to electrically connect to an external device, such as another semiconductor chip or a board. Some of the first connection bumps 180 may be electrically connected to the individual semiconductor devices formed in the first active area A1 via rewiring (not shown).

The first connection bump 180 may include one selected from the group consisting of a conductive bump, a conductive spacer, a solder ball, a pin grid array (PGA), and a combination of these.

For example, the first protection layer 140 may include a silicon nitride. Below or inside the first protection layer 140, a wiring or rewiring for electrical connection between the first pad 160 and the individual semiconductor devices included in the first semiconductor chip C1 may be formed.

The first pad 160 may be exposed at the first protection layer 140. An exposed surface of the first pad 160 and an exposed surface of the first protection layer 140 may be on the same plane. Alternatively, although not shown in FIG. 1A, the exposed surface of the first pad 160 may be either higher or lower than the exposed surface of the first protection layer 140.

Some of the first connection bumps 180 may be electrically connected to the first through electrode 120 so as to be electrically connected to the second or third semiconductor chip C2 or C3. Here, electrical connection to the semiconductor chips indicates electrical connection to the individual semiconductor devices formed in the semiconductor chips.

The first through electrode 120 may be formed passing through the first semiconductor chip C1. However, selectively, the first through electrode 120 may not be directly exposed at the first surface 102 or the second surface 104a via a conductive material, such as the first pad 160. A portion of the first through electrode 120 may protrude from the second surface 104a of the first semiconductor chip C1. The first through electrode 120 may include Ag, Au, Cu, W, Al, or In.

An insulation material layer (not shown) is formed around the first through electrode 120 so as to electrically insulate portions of the first semiconductor chip C1 contacting the first through electrode 120 from the first through electrode 120. The insulation material may include, for example, a silicon oxide, a silicon nitride, a silicon oxynitride, a metal silicate, or an organic silicate.

Also, a barrier layer (not shown) and/or a seed layer (not shown) may be further formed between the first through electrode 120 and the insulation material layer. The barrier layer may include, for example, Ti, TiN, Ru, Co, Mn, WN, Ni, NiB, Ta, or TaN.

The first through electrode 120 is usually referred to as a through-silicon via (TSV) because semiconductor chips are usually formed of silicon, but is not limited to passing through a silicon substrate. Thus, the first through electrode 120 may also be referred to as a TSV when the first through electrode 120 passes through a semiconductor chip formed of a material other than silicon.

The second semiconductor chip C2 may be attached on the second surface 104a of the first semiconductor chip C1. A plurality of second connection bumps 180a attached to the second semiconductor chip C2 may contact each first through electrode 120 formed in the first semiconductor chip C1, thereby electrically connecting the first through electrode 120 to the second semiconductor chip C2. Also, a first filler material layer 60a may be formed between the first semiconductor chip C1 and the second semiconductor chip C2. Alternatively, the first filler material layer 60a may be formed of the same material as a molding layer 80, which will be described later. When the first filler material layer 60a is formed together with the molding layer 80 as described above, the first filler material layer 60a may be a portion of the molding layer 80.

Description of the second active area A2, the second connection bumps 180a, the second through electrode 120a, a second protection layer 140a, and at least one second pad 160a included in the second semiconductor chip C2 is not mentioned here and may respectively correspond to the description of the first active area A1, the first connection bumps 180, the first through electrode 120, the first protection layer 140, and the first pad 160 included in the first semiconductor chip C1.

Likewise, the third semiconductor chip C3 may also be attached on the second semiconductor chip C2. In this case, the third semiconductor chip C3 may be electrically connected to the second through electrode 120a of the second semiconductor chip C2 via a plurality of third connection bumps 180b.

The third semiconductor chip C3 may include the third through electrode 120b. However, if the third semiconductor chip C3 is an uppermost semiconductor chip disposed farthest from the first semiconductor chip C1, the third semiconductor chip C3 may not include the third through electrode 120b.

When the third semiconductor chip C3 includes the third through electrode 120b, the third semiconductor chip C3 is the same type of semiconductor chip as the second semiconductor chip C2, and may be mass produced in the same process.

Description of a third active area A3, third connection bumps 180b, the third through electrode 120b, a third protection layer 140b, and a third pad 160b included in the third semiconductor chip C3 is not mentioned here and may respectively correspond to the description of the first active area A1, the first connection bumps 180, the first through electrode 120, the first protection layer 140, and the first pad 160 included in the first semiconductor chip C1.

In FIG. 1A, the first through third through pads 120, 120a, and 120b are serially aligned but are not limited thereto. As long as the first through third through pads 120, 120a, and 120b are connected to one another as described above, the alignment manner thereof is not limited. That is, the first through third through pads 120, 120a, and 120b may be aligned not serially by rewiring formed in the first through third semiconductor chips C1, C2, and C3.

Also, in FIG. 1A, the first connection bumps 180, the first pad 160, the first through electrode 120, the second connection bumps 180a, the second pad 160a, the second through electrode 120a, the third connection bumps 180b, the third pad 160b, and the third through electrode 120b are sequentially connected to one another but are not limited thereto.

That is, some of the first connection bumps 180 and the first pads 160 may be connected to the first through electrode 120 but some of the rest may not be connected to the first through electrodes 120 but connected to the first active area A1.

Likewise, some of the second connection bumps 180a and the second pads 160a may be connected to the second through electrode 120a but some of the rest may not be connected to the second through electrode 120a but connected to the second active area A2. Also, the third connection bumps 180b and the third pad 160b may not be connected to the third through electrode 120b but connected to the third active area A3.

Some of the first connection bumps 180 may be connected to all of the first through third active areas A1, A2, and A3. For example, some of the first connection bumps 180 connected to an external power source are connected to all of the first through third active areas A1, A2, and A3, thereby supplying power to the first through third active areas A1, A2, and A3.

That is, referring to FIG. 1A, the first connection bumps 180, the first pads 160, the first through electrode 120, the second connection bumps 180a, the second pad 160a, the second through electrode 120a, the third connection bumps 180b, the third pads 160b, and the third through electrodes 120b are exemplarily connected from an external connection terminal of the lowermost semiconductor chip (e.g., the first semiconductor chip C1) to the uppermost semiconductor chip (e.g., the third semiconductor chip C3) via through electrodes.

Chip surface areas of the second and third semiconductor chips C2 and C3 may be smaller than a chip surface area of the first semiconductor chip C1. In this case, a portion of the first semiconductor chip C1 may be exposed by the second semiconductor chip C2.

A chip surface area of the third semiconductor chip C3 may be smaller than that of the second semiconductor chip C2. In this case, a portion of the second semiconductor chip C2 may be exposed by the third semiconductor chip C3. Alternatively, the second semiconductor chip C2 and the third semiconductor chip C3 may have the same chip surface areas.

As long as the molding layer 80 surrounds the second and third semiconductor chips C2 and C3, the second and third semiconductor chips C2 and C3 may have a larger chip surface area than that of the first semiconductor chip C1 unlike in FIG. 1A.

Among the first through third semiconductor chips C1, C2, and C3, semiconductor chips having the same chip surface area may be homogeneous semiconductor chips. Among the first through third semiconductor chips C1, C2, and C3, semiconductor chips having different chip surface areas may be heterogeneous semiconductor chips.

As will be described later, the first semiconductor chip C1 is supplied as a semiconductor substrate including a plurality of first semiconductor chips C1, and the plurality of first semiconductor chips C1 are separated after the second and third semiconductor chips C2 and C3, which are individually separated, are attached to the first semiconductor chips C1.

Some of the first through third semiconductor chips C1, C2, and C3 may include a memory device. Alternatively, some of the first through third semiconductor chips C1, C2, and C3 may include a logic device. For example, the semiconductor package 1a may include semiconductor chips including memory devices and semiconductor chips controlling the memory devices. Alternatively, the semiconductor package 1a may be, for example, a system on chip (SOC) including various types of semiconductor chips.

The first through third semiconductor chips C1, C2, and C3 may be surrounded by the molding layer 80. However, the first surface 102 of the first semiconductor chip C1 may not be surrounded by the molding layer 80 but be exposed. The molding layer 80 may completely surround lateral sides of the first through third semiconductor chips C1, C2, and C3. Also, the molding layer 80 may completely surround the semiconductor chips, such that the uppermost semiconductor chip that is disposed the farthest from the first semiconductor chip C1, for example, the third semiconductor chip C3, is not exposed.

The molding layer 80 may include a protrusion 80a protruding from the first surface 102 of the first semiconductor chip C1 by a first thickness T1. The molding layer 80 may include, for example, an epoxy molding compound (EMC) or ceramic material. The first thickness T1 may be, for example, 5 to 20 μm. The first thickness T1 of the protrusion 80a may be less than a second thickness T2, which is a thickness of the first connection bumps 180 measured from the first surface 102. The second thickness T2 may be, for example, 10 to 40 μm.

The protrusion 80a may extend along a lateral side of the first semiconductor chip C1 to protrude from the second surface 102. Accordingly, a width D1 of the protrusion 80a may be the same as a thickness of the molding layer 80 formed on the lateral side of the first semiconductor chip C1. Accordingly, the first surface 102 of the first semiconductor chip C1 may be completely exposed at the molding layer 80.

The protrusion 80a may protect the lateral sides of the first surface 102 of the first semiconductor chip C1, which may be relatively weak. However, when the semiconductor package 1a is attached to an external device using the first connection bumps 180, the protrusion 80a may be formed to protrude less from the first surface 102 than the first connection bumps 180 so as not to disrupt connection between the first connection bumps 180 and the external device.

Accordingly, only the first surface 102 of the semiconductor chip C1 and the first connection bumps 180 attached to the first semiconductor chip C1 are exposed in the semiconductor package 1a, and the rest of the elements may be surrounded by the molding layer 80.

Figure 1B:
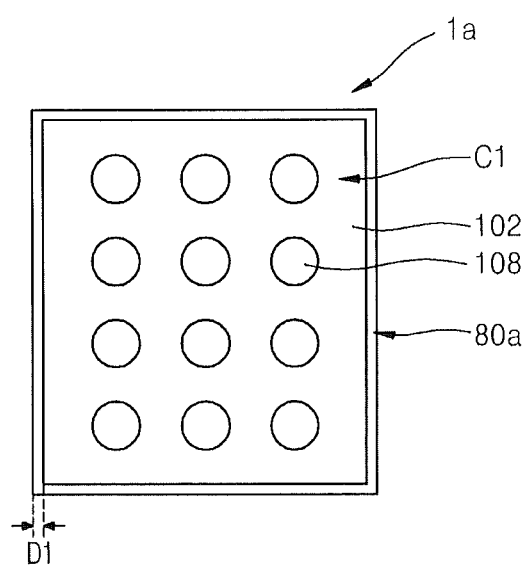

FIG. 1B illustrates a bottom view of the semiconductor package 1a according to the embodiment of the inventive concept.

Referring to FIG. 1B, the plurality of first connection bumps 108 may be attached on the first surface 102 of the first semiconductor chip C1 included in the semiconductor package 1a. The protrusion 80a may continuously extend along the boundary of the first semiconductor chip C1, that is, along the boundary of the first surface 102.

The bottom view of the semiconductor package 1a of FIG. 1B may also apply to other semiconductor packages according to other embodiments of the inventive concept that will be described below.

The semiconductor packages according to other embodiments of the inventive concept described below may include elements equivalent to or corresponding to the elements described with reference to the embodiment of FIG. 1A.

Figure 2:
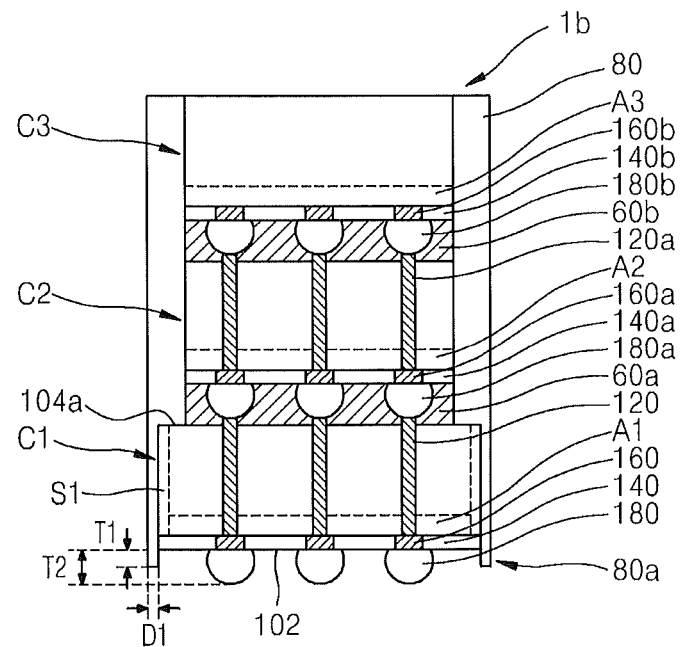

FIG. 2 is a cross-sectional view illustrating the semiconductor package 1b according to a modified embodiment of the semiconductor package 1a of the inventive concept. Description of elements illustrated in FIG. 2 is not mentioned here and may correspond to the elements described with reference to FIG. 1A.

Referring to FIG. 2, the semiconductor package 1b includes first through third semiconductor chips C1, C2, and C3. A molding layer 80 surrounds the first through third semiconductor chips C1, C2, and C3. Differently from the semiconductor package 1a of FIG. 1A, the molding layer 80 formed in the semiconductor package 1b of FIG. 2 may expose a portion of the third semiconductor chip C3.

That is, a surface of the third semiconductor chip C3 opposite to a third active area A3 may be exposed at the molding layer 80. A heat sink, a thermoelectric device, or the like may be selectively attached to the exposed surface of the third semiconductor chip C3.

Unlike the semiconductor package 1a illustrated in FIG. 1A, the third semiconductor chip C3 included in the semiconductor package 1b may not include a through electrode. However, when a device that requires a power source, for example, a thermoelectric device, is attached to the exposed surface of the third semiconductor chip C3, the third semiconductor chip C3 may include a third through electrode 120b, like the semiconductor package 1a of FIG. 1A.

That is, in the semiconductor package 1b according to the modified embodiment of the inventive concept, a portion of the third semiconductor chip C3 may be exposed at the molding layer 80 to thereby reduce the height of the whole semiconductor package 1b. Alternatively, a heat sink or a thermoelectric device may be attached to the semiconductor package 1b to facilitate heat radiation of the semiconductor package 1b.

Figure 3:
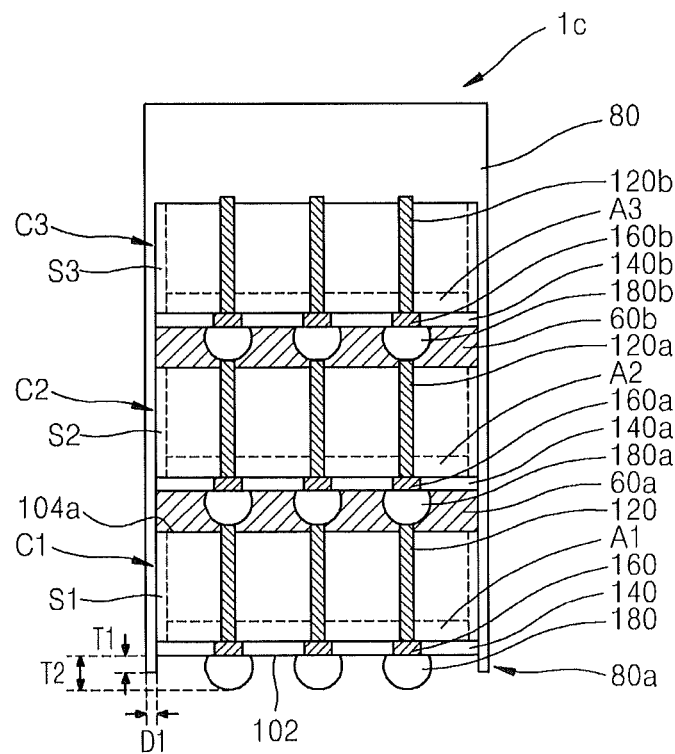

FIG. 3 is a cross-sectional view illustrating the semiconductor package 1c according to a modified embodiment of the semiconductor package 1a of the inventive concept.

Referring to FIG. 3, the semiconductor package 1c includes first through third semiconductor chips C1, C2, and C3. A molding layer 80 surrounds the first through third semiconductor chips C1, C2, and C3. Unlike the semiconductor package 1a of FIG. 1A, the first through third semiconductor chips C1, C2, and C3 may have the same chip surface areas.

As will be described later, the first through third semiconductor chips C1, C2, and C3 are respectively supplied as semiconductor substrates including the first through third semiconductor chips C1, C2, and C3. The first through third semiconductor chips C1, C2, and C3 are attached and separated into respective semiconductor chips together.

The semiconductor package 1c may be a stack package in which homogeneous semiconductor chips are stacked. For example, the semiconductor package 1c may be a stack memory package in which homogeneous semiconductor memory chips are stacked to increase memory capacity of a single package.

Around the first through third semiconductor chips C1, C2, and C3, first through third scribe lane regions S1, S2, and S3 that remain after cutting scribe lanes may be included. When the first through third semiconductor chips C1, C2, and C3 have the same chip surface areas and are homogeneous semiconductor chips, the first through third scribe lane regions S1, S2, and S3 may also have the same surface areas. Surface areas of the first through third scribe lane regions S1, S2, and S3 refer to surface areas of scribe lanes remaining on surfaces where the first through third active areas A1, A2, and A3 are formed.

Figure 4:
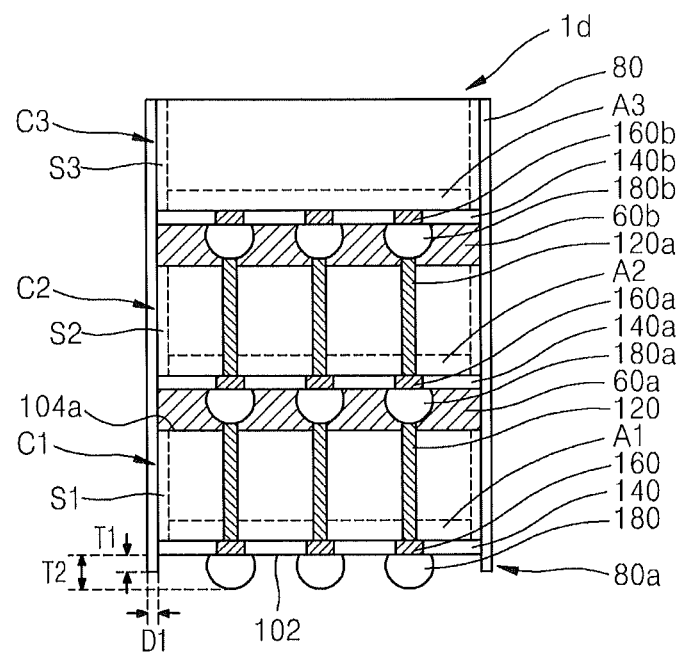

FIG. 4 is a cross-sectional view illustrating the semiconductor package 1d according to a modified embodiment of the semiconductor package 1a of the inventive concept.

Referring to FIG. 4, the semiconductor package 1d includes first through third semiconductor chips C1, C2, and C3. A molding layer 80 surrounds the first through third semiconductor chips C1, C2, and C3. Unlike the semiconductor package 1c of FIG. 3, the molding layer 80 formed in the semiconductor package 1d of FIG. 4 may expose a portion of the third semiconductor chip C3.

That is, a surface of the third semiconductor chip C3 opposite to a third active area A3 may be exposed at the molding layer 80 in the semiconductor package 1d. A heat sink, a thermoelectric device, or the like may be selectively attached to the exposed surface of the third semiconductor chip C3. In addition, although not shown in FIG. 4, the third semiconductor chip C3 may include a third through electrode 120b, like the semiconductor package 1c of FIG. 3.

Figure 5:
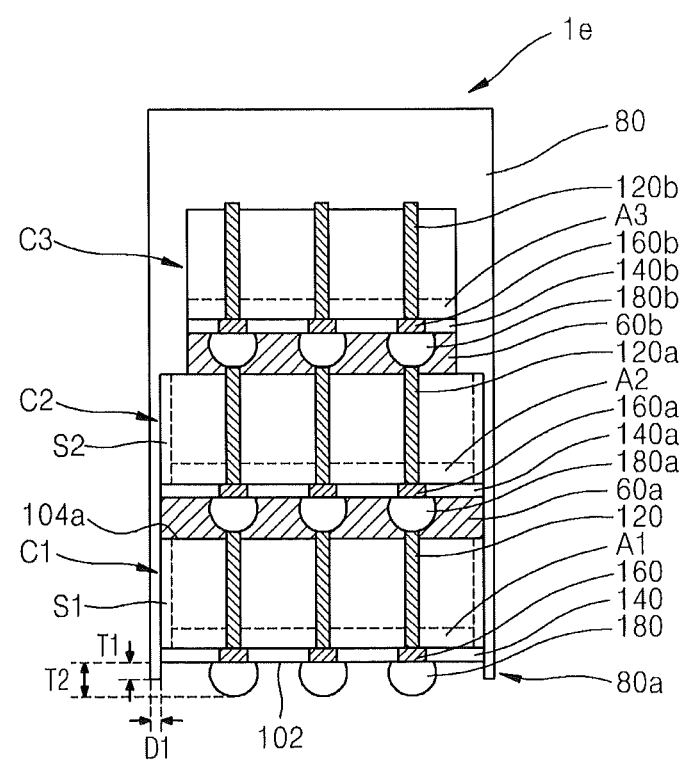

FIG. 5 is a cross-sectional view illustrating the semiconductor package 1e according to a modified embodiment of the semiconductor package 1a of the inventive concept.

Referring to FIG. 5, the semiconductor package 1e includes first through third semiconductor chips C1, C2, and C3. A molding layer 80 surrounds the first through third semiconductor chips C1, C2, and C3. Unlike the semiconductor package 1a of FIG. 1A, the first through third semiconductor chips C1, C2, and C3 may have the same chip surface areas in the semiconductor package 1e illustrated in FIG. 5.

The semiconductor package 1e illustrated in FIG. 5 is clearly different from the semiconductor package 1a of FIG. 1A in terms of a manufacturing process. The first and second semiconductor chips C1 and C2 included in the semiconductor package 1e of FIG. 5 may be formed in the same manner as the first and second semiconductor chips C1 and C2 included in the semiconductor package 1c illustrated in FIG. 3.

In addition, the third semiconductor chip C3 included in the semiconductor package 1e illustrated in FIG. 5 may be formed in the same manner as the second or third semiconductor chip C2 or C3 included in the semiconductor package 1a illustrated in FIG. 1A.

That is, the first and second semiconductor chips C1 and C2 are supplied and attached as a semiconductor substrate including a plurality of, for example, first and second semiconductor chips C1 and C2, and are separated into respective semiconductor chips after the individually separated third semiconductor chip C3 is attached.

That is, the semiconductor package 1d of FIG. 5 is a combination of the semiconductor package 1a illustrated in FIG. 1A and the semiconductor package 1c illustrated in FIG. 3.

Accordingly, the semiconductor package 1d according to the third embodiment may be manufactured by combining the method of manufacturing the semiconductor package 1a according to the first embodiment of the inventive concept, which will be described with reference to FIG. 19, and the method of manufacturing the semiconductor package 1c, which will be described with reference to FIGS. 20 through 24.

The semiconductor package 1e may be a stack package in which a plurality of homogeneous semiconductor chips and at least one semiconductor chip having a relatively small chip surface area are stacked. For example, the semiconductor package 1e may be a stack memory package in which homogeneous semiconductor memory chips and controller chips for controlling the semiconductor memory chips are stacked together to increase memory capacity in a single package.

Figure 6:
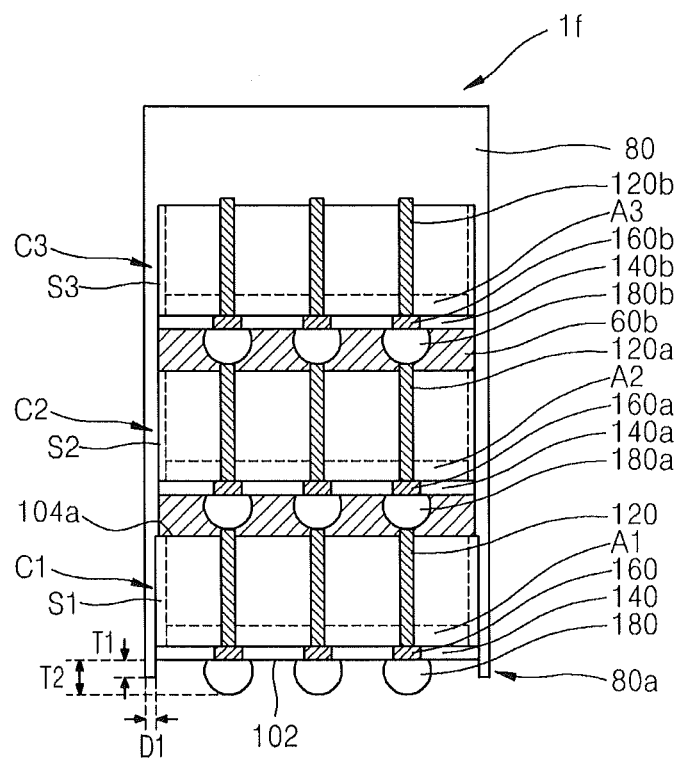

FIG. 6 is a cross-sectional view illustrating the semiconductor package 1f according to a modified embodiment of the semiconductor package 1a of the inventive concept.

Referring to FIG. 6, the semiconductor package 1f includes first through third semiconductor chips C1, C2, and C3. A molding layer 80 surrounds the first through third semiconductor chips C1, C2, and C3. Unlike the semiconductor package 1a of FIG. 1A, the first through third semiconductor chips C1, C2, and C3 may be homogeneous semiconductor chips in the semiconductor package 1f illustrated in FIG. 6.

However, like the semiconductor package 1a of FIG. 1A, the second and third semiconductor chips C2 and C3 of the semiconductor package 1f illustrated in FIG. 6 may have smaller chip surface areas than that of the first semiconductor chip C1.

Referring to FIGS. 3 and 6, the semiconductor package 1c of FIG. 3 and the semiconductor package 1f of FIG. 6 may include the first through third semiconductor chips C1, C2, and C3, which are homogenous semiconductor chips. However, a first remaining scribe lane region S1 included in the semiconductor package 1f may have a larger surface area than a second remaining scribe lane region S2 of the second semiconductor chip C2 or a third remaining scribe lane region S3 of the third semiconductor chip C3. Accordingly, the surface area of the first semiconductor chip C1 included in the semiconductor package 1f illustrated in FIG. 6 may have a larger surface area than that of the second semiconductor chip C2 or the third semiconductor chip C3.

Thus, the semiconductor package 1f of the embodiment illustrated in FIG. 6 corresponds to the semiconductor package 1a of the embodiment illustrated in FIG. 1A in which homogenous semiconductor chips are used as the first through third semiconductor chips C1, C2, and C3.

The semiconductor package 1f may be a stack package in which homogeneous semiconductor chips are stacked. For example, the semiconductor package 1f may be a stack memory package in which homogeneous semiconductor memory chips are stacked to increase memory capacity in a single package.

Figure 7:
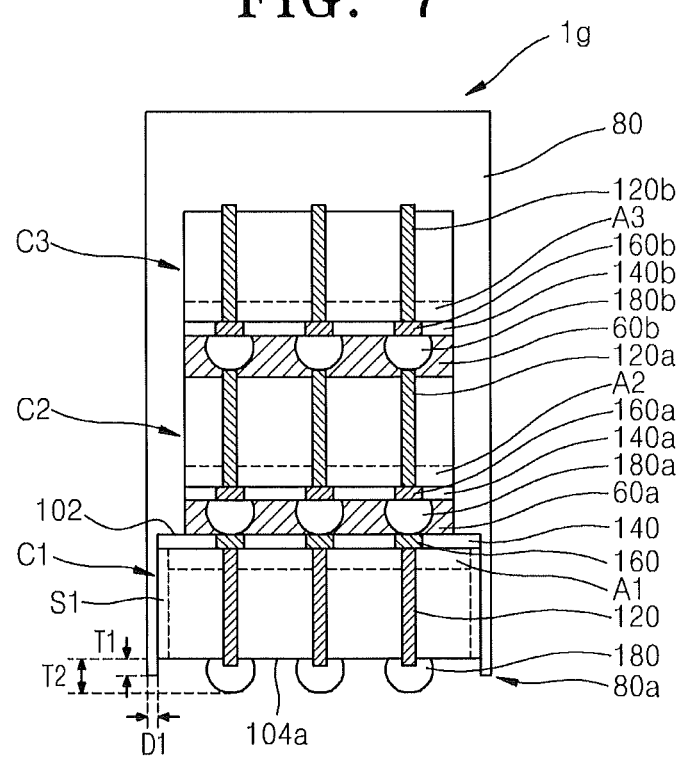

FIG. 7 is a cross-sectional view illustrating the semiconductor package 1g according to a modified embodiment of the semiconductor package 1a of the inventive concept.

Referring to FIG. 7, the semiconductor package 1g includes first through third semiconductor chips C1, C2, and C3. A molding layer 80 surrounds the first through third semiconductor chips C1, C2, and C3. Unlike the semiconductor package 1a of FIG. 1A, a first surface 102 of the first semiconductor chip C1, that is, an active surface 102, faces the second semiconductor chip C2. Also, although not shown in FIG. 7, an active surface of the second semiconductor chip C2 may face the third semiconductor chip C3.

That is, in the semiconductor package 1a illustrated in FIG. 1A, the first semiconductor chip C1 may have a "face-down" form in which an active surface of the first semiconductor chip C1 faces downward. However, the first semiconductor chip C1 of the semiconductor package 1g of FIG. 7 may have a "face-up" form in which an active surface of the first semiconductor chip C1 faces upward.

Accordingly, unlike the semiconductor package 1a illustrated in FIG. 1A, the semiconductor package 1g illustrated in FIG. 7 may have a ""face-to-face" form in which actives surfaces of the first semiconductor chip C1 and the second semiconductor chip C2 face each other.

The semiconductor package 1g may be a stack semiconductor package that may be applied when a signal transmission speed between the first semiconductor chip C1 and the second semiconductor chip C2 is significant.

FIGS. 8 through 17 are cross-sectional views illustrating a method of manufacturing the semiconductor package 1a, according to an embodiment of the inventive concept.

Figure 8:
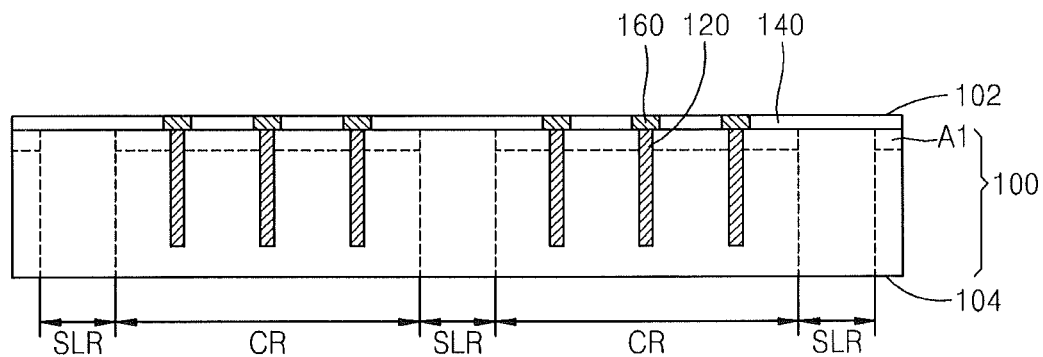
FIGS. 8 through 17 are cross-sectional views illustrating a method of manufacturing the semiconductor package of FIG. 1A, according to an embodiment of the inventive concept.

FIG. 8 is a cross-sectional view illustrating an operation of providing a first preliminary semiconductor substrate 100 of the semiconductor package 1a, according to an embodiment of the inventive concept.

Referring to FIG. 8, the first preliminary semiconductor substrate 100 includes a first surface 102 and a second surface 104 opposite to the first surface 102. The first preliminary semiconductor substrate 100 may also be referred to as a first semiconductor substrate 100. The term, the first preliminary semiconductor substrate 100, is used to distinguish the first preliminary semiconductor substrate 100 from a first semiconductor substrate 100a illustrated in FIG. 12. The first semiconductor substrate 100a illustrated in FIG. 12 refers to a remaining portion of the first preliminary semiconductor substrate 100 illustrated in FIG. 8 after a portion of the first preliminary semiconductor substrate 100 is removed. Accordingly, when comparison with the first semiconductor substrate 100a illustrated in FIG. 2 is necessary, the first preliminary semiconductor substrate 100 may be mentioned but in all the other cases, the first preliminary semiconductor substrate 100 may be referred to as the first semiconductor substrate 100.

For example, the first preliminary semiconductor substrate 100 may be formed of a typical semiconductor substrate having a planar upper surface, such as a silicon substrate. Alternatively, the first preliminary semiconductor substrate 100 may be formed of, for example, a compound semiconductor substrate, such as a SOI substrate, a silicon-germanium substrate, a silicon-carbide substrate, or a gallium-arsenic substrate.

The first preliminary semiconductor substrate 100 may be formed of chip regions CR where individual semiconductor chips are formed so as to form semiconductor chips and chip cutting regions SLR that are between the individual semiconductor chips and used in separating the individual semiconductor chips. The chip regions CR and the chip cutting regions SLR of the first semiconductor substrate 100 may also be referred to as first chip regions and first chip cutting regions.

The chip cutting regions SLR may refer to portions generally referred to as scribe lanes. Thus, the chip regions CR may each be distinguished by the chip cutting regions SLR. First semiconductor chips, which will be described later, may respectively correspond to individual chip regions CR or to some of the chip cutting regions SLR surrounding the individual chip regions CR.

Individual semiconductor devices may be formed on the first surface 102 of the first preliminary semiconductor substrate 100. Accordingly, a first active area A1 where the individual semiconductor devices are to be formed may be formed on the first surface 102. Accordingly, the first surface 102 may be referred to as a first active surface 102.

A first through electrode 120 may be buried in the first preliminary semiconductor substrate 100. The first through electrode 120 may include Ag, Au, Cu, W, Al, or In.

The first through electrode 120 may completely pass through the first preliminary semiconductor substrate 100, extending from the first surface 102 to the second surface 104. However, the first through electrode 120 may not completely pass through the first preliminary semiconductor substrate 100 so that the first through electrode 120 has a passed-through form only after a portion of the first preliminary semiconductor substrate 100 is removed in a subsequent operation. That is, in order that the first through electrode 120 may pass through the first semiconductor substrate 100a illustrated in FIG. 12, which will be described later, the first through electrode 120 may be buried to a predetermined depth in the first preliminary semiconductor substrate 100 and may not extend to the second surface 104.

An insulation material layer (not shown) may be formed between the first through electrode 120 and the first preliminary semiconductor substrate 100 adjacent to the first through electrode 120. The insulation material layer may include, for example, a silicon oxide, a silicon nitride, a silicon oxynitride, a metal silicate, or an organic silicate.

Also, a barrier layer (not shown) and/or a seed layer (not shown) may be further formed between the first through electrode 120 and the insulation material layer. For example, the barrier layer may include Ti, TiN, Ru, Co, Mn, WN, Ni, NiB, Ta, or TaN.

After the first active area A1 where individual semiconductor devices are formed is formed on the first surface 102 of the first semiconductor substrate 100, a first protection layer 140 protecting the first active area A1 may be formed. The first protection layer 140 may be formed of a single material layer or a plurality of stacked material layers. The first protection layer 140 may be formed of an insulation material. The first protection layer 140 may include, for example, a nitride or an oxide.

The first preliminary semiconductor substrate 100 may include a first pad 160 that is exposed at the first protection layer 140. The first pad 160 may be electrically connected to the first through pad 120 or the individual semiconductor devices in the first active area A1

A redistribution wiring (not shown) may be formed between the first pad 160 and the first through pad 120 or between the first pad 160 and the first active area A1. The position of the first pad 160 or the first through pad 120 may differ according to the redistribution wiring.

When the redistribution wiring is formed, the first protection layer 140 may have a multi-layer structure including a layer protecting the first active area A1 and an insulation layer for the rewiring.

Figure 9:
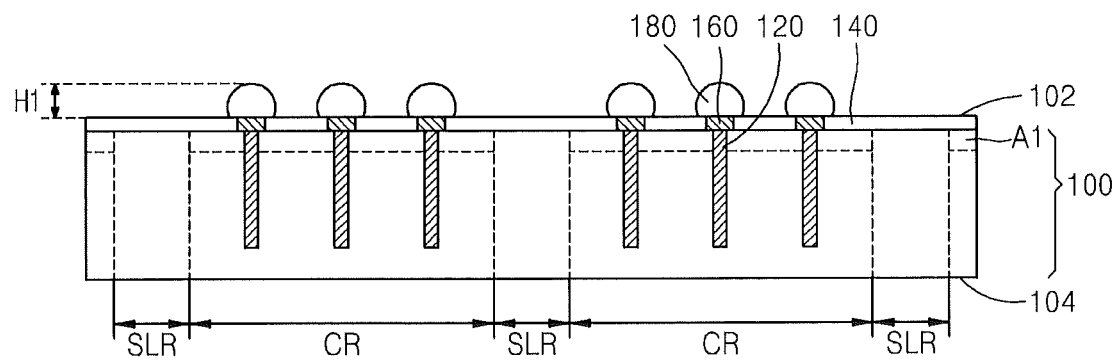

FIG. 9 is a cross-sectional view illustrating an operation of forming a plurality of first connection bumps 180 of the semiconductor package 1a, according to an embodiment of the inventive concept.

Referring to FIG. 9, the first connection bumps 180 are formed on the first preliminary semiconductor substrate 100.

The first connection bumps 180 may each be attached to the first pad 160 to contact the first pad 160.

The first connection bumps 180 may include one structure selected from the group consisting of a conductive bump, a conductive spacer, a solder ball, a pin grid array (PGA), and/or combinations of these. The first through electrode 120 or the first active area A1 may be electrically connected to an external device, such as another semiconductor chip or a board via the first connection bumps 180.

The first connection bumps 180 may have a first height H1 from the first surface 102 of the first preliminary semiconductor substrate 100. The first height H1 may be, for example, 10 to 40 µm. The first height H1 may correspond to the second thickness T2 described with reference to FIG. 1A.

Figure 10:
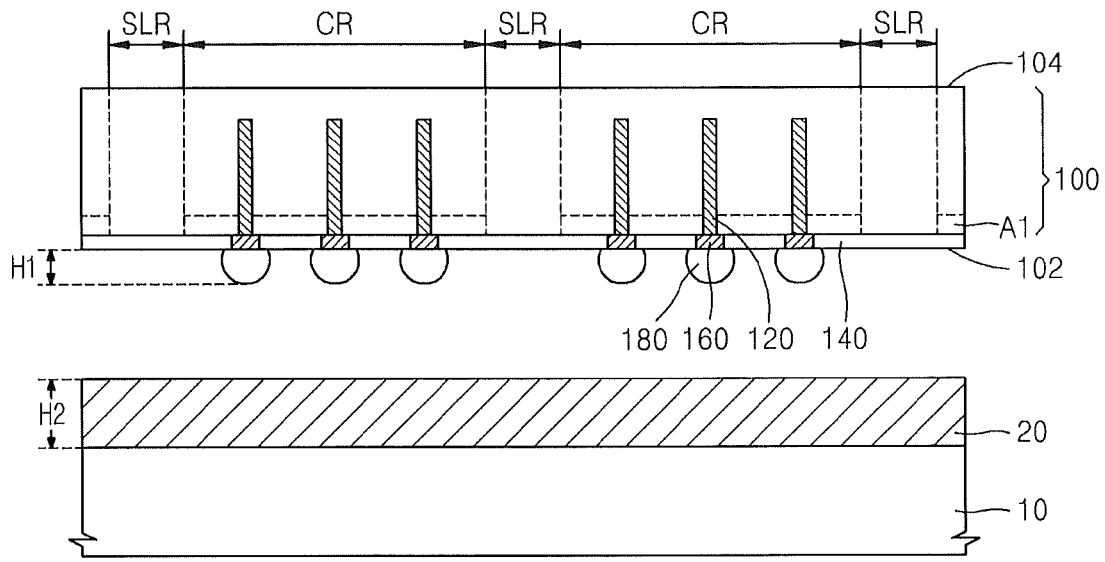

FIG. 10 is a cross-sectional view illustrating an operation of providing a support substrate 10 of the semiconductor package 1a, according to an embodiment of the inventive concept.

Referring to FIG. 10, the support substrate 10 to which an adhesive layer 20 is attached is provided. The support substrate 10 may be, for example, a semiconductor substrate, such as a silicon substrate, a glass substrate, a ceramic substrate, or a metal substrate. The adhesive layer 20 has adhesive characteristics, and may be flexible because the adhesive layer 20 is not cured. The adhesive layer 20 may have a second height H2 with respect to the support substrate 10. The second height H2 may be at least 30 µm and less than or equal 200 µm.

The adhesive layer 20 may be formed in advance and then attached on the support substrate 10 or may be formed by coating the support substrate 10 with an adhesive material and annealing the same. For example, the adhesive layer 20 may be formed of a silicon resin, an epoxy resin, a polyimide resin, or an acrylic resin.

The first preliminary semiconductor substrate 100, to which the first connection bumps 180 are attached, is provided on the support substrate 10. The first connection bumps 180 attached to the first preliminary semiconductor substrate 100 and the adhesive layer 20 attached on the support substrate 10 may face each other.

Figure 11:
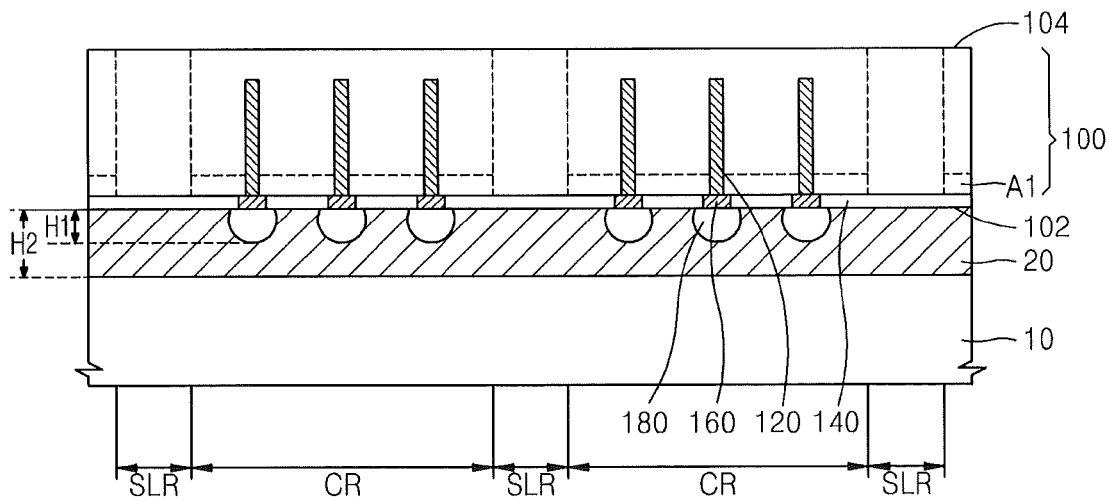

FIG. 11 is a cross-sectional view illustrating an operation of attaching the first preliminary semiconductor substrate 100 to the support substrate 10 of the semiconductor package 1a, according to an embodiment of the inventive concept.

Referring to FIG. 11, the first preliminary semiconductor substrate 100 is attached to the support substrate 10 using the adhesive layer 20. The first surface 102 of the first preliminary semiconductor substrate 100 may be disposed facing the adhesive layer 20 formed on the support substrate 10.

If the adhesive layer 20 is flexible, the first height H1 of the first connection bumps 180 is less than the second height H2 of the adhesive layer 20 and, thus, exposed surfaces of the first connection bumps 180 may be completely surrounded by the adhesive layer 20. Accordingly, the adhesive layer 20 may surround an exposed portion of the first surface 102 of the first semiconductor substrate 10 and the exposed surfaces of the first connection bump 180.

Then, to firmly attach the first preliminary semiconductor substrate 100 to the support substrate 10, an annealing operation for curing a portion of the adhesive layer 20 or the whole adhesive layer 20 may be performed selectively.

Figure 12:
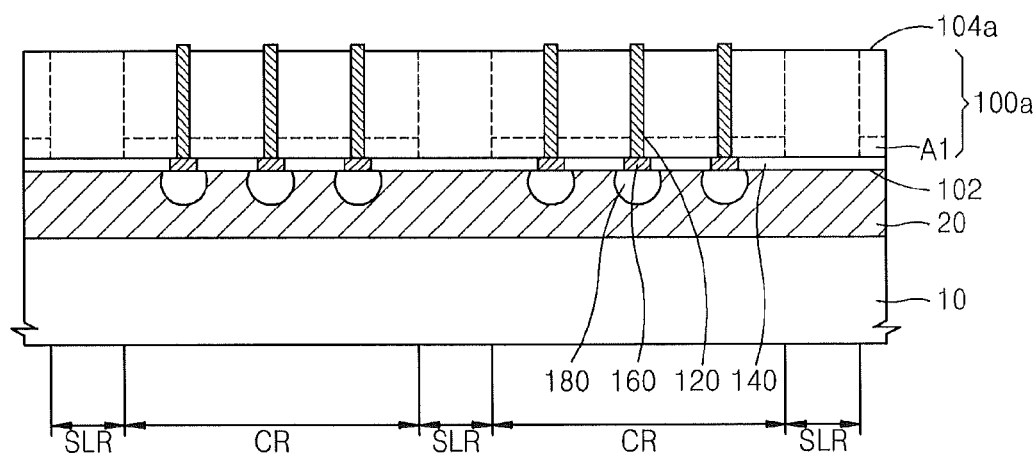

FIG. 12 is a cross-sectional view illustrating an operation of removing a portion of the first preliminary semiconductor substrate 100 of the semiconductor package 1a, according to an embodiment of the inventive concept.

Referring to FIG. 12, a portion of the first preliminary semiconductor substrate 100 illustrated in FIG. 11 is removed from the second surface 104 so as to expose the first through electrode 120. To expose the first through electrode 120, a chemical mechanical polishing (CMP) operation or an etching operation may be performed. As described above, the operation of removing a portion of the first preliminary semiconductor substrate 100 illustrated in FIG. 11 to form the first semiconductor substrate 100a as illustrated in FIG. 12 is referred to as a back-lap process.

Strictly speaking, the second surface 104 of the first preliminary semiconductor substrate 100 illustrated in FIG. 11 and the second surface 104a of the first semiconductor substrate 100a illustrated in FIG. 12 are different, but both may be referred to as a second surface because they are both opposite to the same first surface 102.

Due to a polishing selectivity or etching selectivity, portions of the first through electrode 120 exposed from the second surface 104a of the first semiconductor substrate 100a may protrude from the second surface 104a of the first semiconductor substrate 100a.

Figure 13:
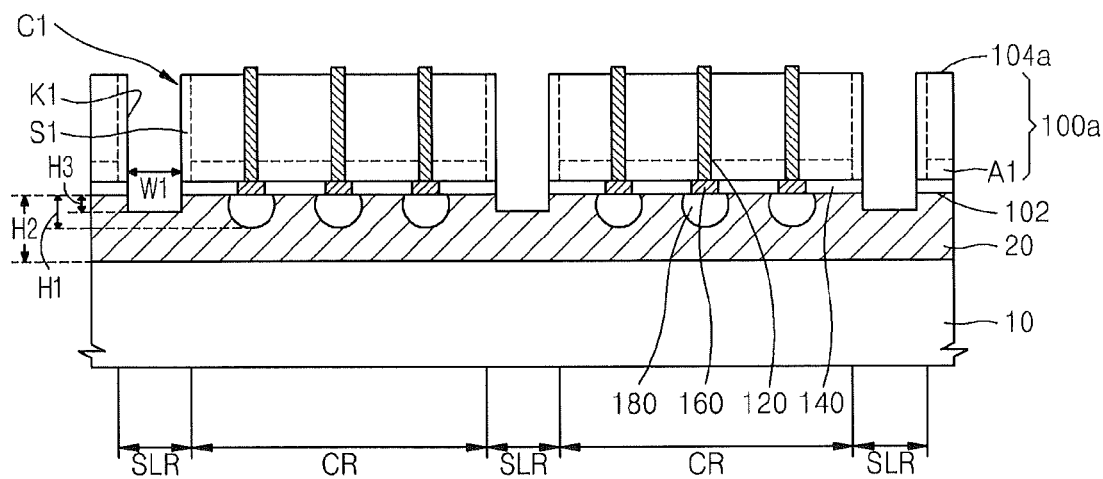

FIG. 13 is a cross-sectional view illustrating an operation of forming a first cutting groove K1 in the first semiconductor substrate 100a of the semiconductor package 1a, according to an embodiment of the inventive concept.

Referring to FIG. 13, the first cutting groove K1 is formed in the first semiconductor substrate 100a to separate the first semiconductor substrate 100a into a plurality of first semiconductor chips C1. The first cutting groove K1 may be formed by removing a portion of the chip cutting region SLR of the first semiconductor substrate 100a. The first cutting groove K1 may be formed by removing a portion of the chip cutting region SLR of the first semiconductor substrate 100a and a portion of the adhesive layer 20 in the chip cutting region SLR. The first cutting groove K1 may be formed using a blade or laser.

After removing the portion of the chip cutting region SLR via the first cutting groove K1, a remaining portion of the chip cutting region SLR surrounding the chip region CR may be referred to as the first remaining scribe lane region S1.

The first cutting groove K1 may be formed by removing only a portion of the adhesive layer 20 such that the support substrate 10 is not exposed. The first cutting groove K1 may be formed by removing a portion of the adhesive layer 20 up to the third height H3 with respect to the first semiconductor substrate 100a. Accordingly, the third height H3 may be less than the first height H1. For example, the third height H3 may be 5 to 20 µm. Also, the third height H3 is a depth of the portion that is removed from the adhesive layer 20.

Also, the third height H3 may be less than the second height H2. Accordingly, the first cutting groove K1 may be formed by removing the adhesive layer 20 to a depth between the first surface 102 of the first semiconductor substrate 100a and an uppermost surface of the first connection bumps 180.

Also, because the first semiconductor chips C1 of the first semiconductor substrate 100a are separated from one another in the first semiconductor substrate 100a, two opposite surfaces of the first semiconductor chip C1 are portions of the first surface 102 and the second surface 104a of the first semiconductor substrate 100a, respectively. Accordingly, the two opposite surfaces of the first semiconductor chip C1 may be referred to as the first surface 102 and the second surface 104a.

The first semiconductor chip C1 may be formed of a chip region CR and a first remaining scribe lane region S1 surrounding the chip region CR.

Figure 14:
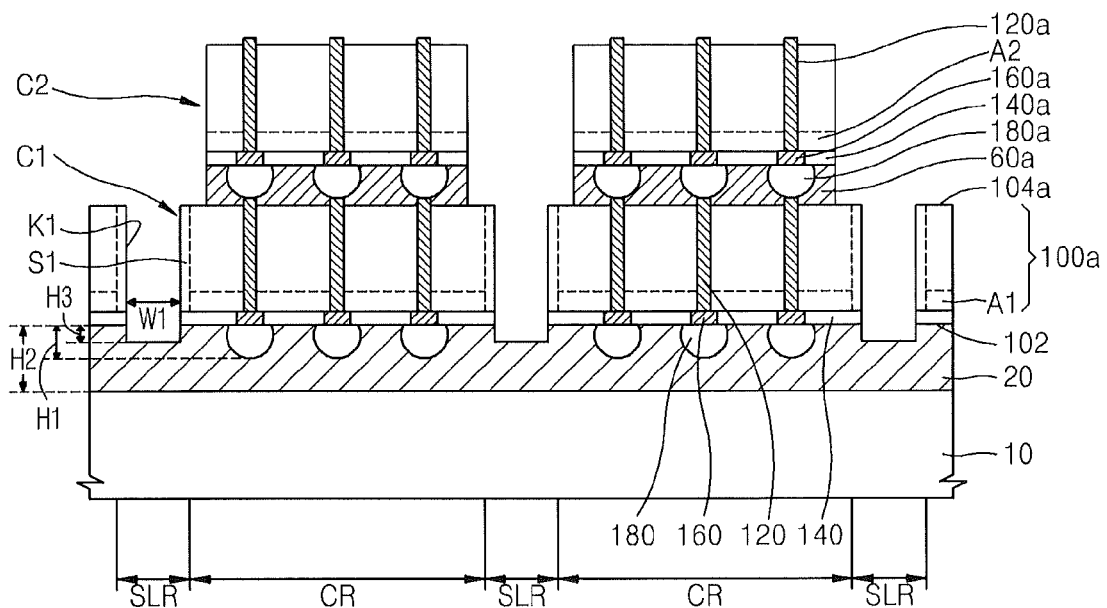

FIG. 14 is a cross-sectional view illustrating an operation of attaching a plurality of second semiconductor chips C2 on the first semiconductor chips C1 of the semiconductor package 1a, according to an embodiment of the inventive concept.

Referring to FIG. 14, the second semiconductor chips C2 are attached to the first semiconductor chips C1 that are separated from one another. The second semiconductor chips C2 may be attached to correspond to the first semiconductor chips C1, respectively. The second semiconductor chips C2 are attached to be stacked on the first semiconductor chips C1 such that portions of the second surface 104a of the first semiconductor chips C1 are exposed. That is, the second semiconductor chips C2 may have smaller chip surface areas than those of the first semiconductor chips C1.

As long as the first cutting groove K1 is not completely covered by the second semiconductor chips C2, the second semiconductor chips C2 may have larger chip surface areas than those of the first semiconductor chips C1. However, in this case also, a distance between the second semiconductor chips C2 needs to be greater than a second width W2 of a second cutting groove K2, which will be described later with reference to FIG. 17.

The second semiconductor chip C2 may include a second active area A2 where individual semiconductor devices are to be formed. Also, a second protection layer 140a protecting the second active area A2 and a second pad 160a exposed at the second protection layer 140a may be formed in the second semiconductor chip C2. Also, a plurality of second connection bumps 180a electrically connected to each second pad 160a may be attached on each second pad 160a.

Description of the second active area A2, the second connection bumps 180a, the second through electrode 120a, the second protection layer 140a, and the second pad 160a included in the second semiconductor chip C2 is not mentioned here and may respectively correspond to the description of the first active area A1, the first connection bumps 180, the first through electrode 120, the first protection layer 140, and the first pad 160 included in the first semiconductor chip C1.

The second semiconductor chips C2 may be attached such that the second connection bumps 180a face the second surface 104a of the first semiconductor chips C1. The second connection bumps 180a may contact each first through electrode 120 exposed from the second surface 104a of the first semiconductor chip C1 to be electrically connected to each first through electrode 120.

The second through electrode 120a may be formed in the second semiconductor chip C2. However, when a semiconductor package to be formed includes only two semiconductor chips, namely, the first semiconductor chip C1 and the second semiconductor chip C2, the second through electrode 120a may not be formed.

The second pad 160a may be electrically connected to the second device region A2 or the second through electrode 120a. Accordingly, the first connection bump 180 may be electrically connected to the second active area or the second through electrode 120a or may be electrically connected to the first active area A1 via the first through electrode 120.

A first under-fill material layer 60a may be formed between the first semiconductor chip C1 and the second semiconductor chip C2. The first under-fill material layer 60a may function as an adhesive layer between the first semiconductor chip C1 and the second semiconductor chip C2. Alternatively, the first under-fill material layer 60a may fill a space between the first semiconductor chip C1 and the second semiconductor chip C2. The first under-fill material layer 60a may be formed in advance before attaching the second semiconductor chip C2 on the first semiconductor chip C1 or may be formed after attaching the second semiconductor chip C2.

Alternatively, the first under-fill material layer 60a may not be formed in this operation. In this case, a molding layer 80, which will be described later with reference to FIG. 16, may function as the first under-fill material layer 60a.

Figure 15:
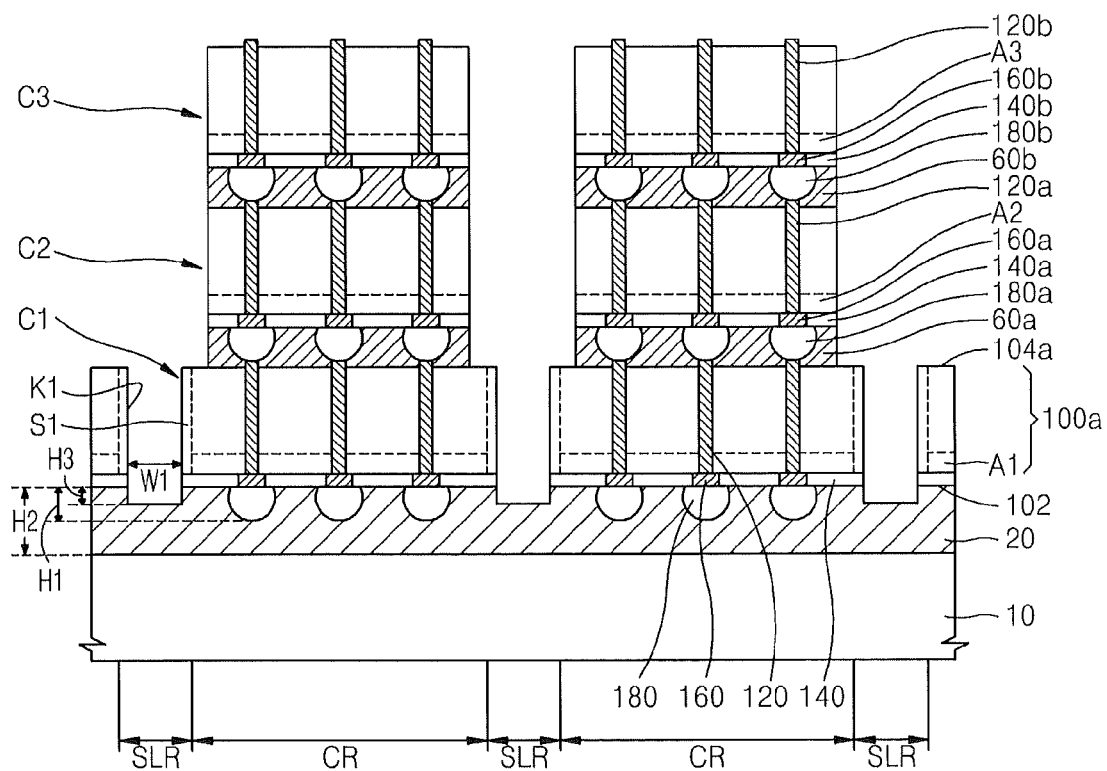

FIG. 15 is a cross-sectional view illustrating an operation of attaching third semiconductor chips C3 on the second semiconductor chips C2 of the of the semiconductor package 1a, according to an embodiment of the inventive concept.

Referring to FIG. 15, third semiconductor chips C3 are respectively attached on the second semiconductor chips C2, which are stacked on the first semiconductor chips C1. In FIG. 15, a chip surface area of each of the third semiconductor chips C3 is the same as the chip surface area of each of the second semiconductor chips C2 but is not limited thereto. For example, the chip surface area of each of the third semiconductor chips C3 may be less than that of each of the second semiconductor chips C2.

Description of the connection between the second semiconductor chips C2 and the third semiconductor chips C3 is not mentioned here and may correspond to the description of the connection between the first semiconductor chips C1 and the second semiconductor chips C2.

Figure 16:
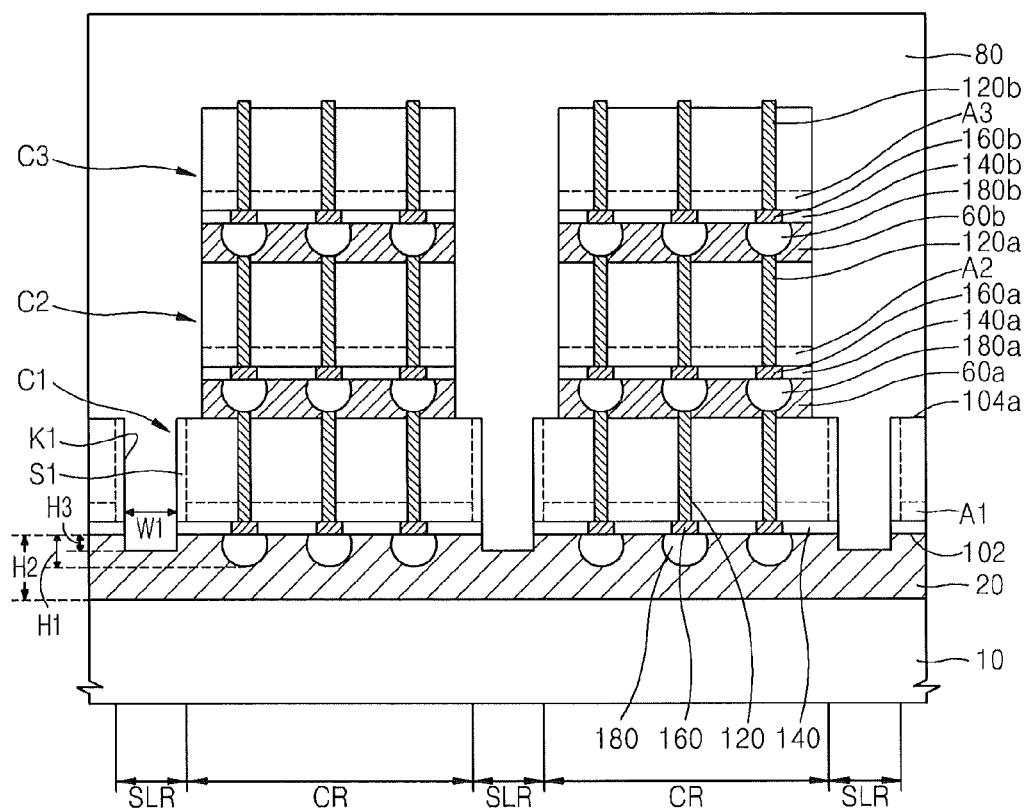

FIG. 16 is a cross-sectional view illustrating an operation of forming the molding layer 80 of the semiconductor package 1a, according to an embodiment of the inventive concept.

Referring to FIG. 16, the molding layer 80 is formed to cover the first through third semiconductor chips C1, C2, and C3. The molding layer 80 may be formed to completely fill the first cutting groove K1. The molding layer 80 may include, for example, an EMC or ceramic material.

As described above, the first under-fill material layer 60a may be separately formed in a previous operation or may be formed as a portion of the molding layer 80. Also, a second under-fill material layer 60b may be separately formed in a previous operation or may be formed as a portion of the molding layer 80.

Figure 17:
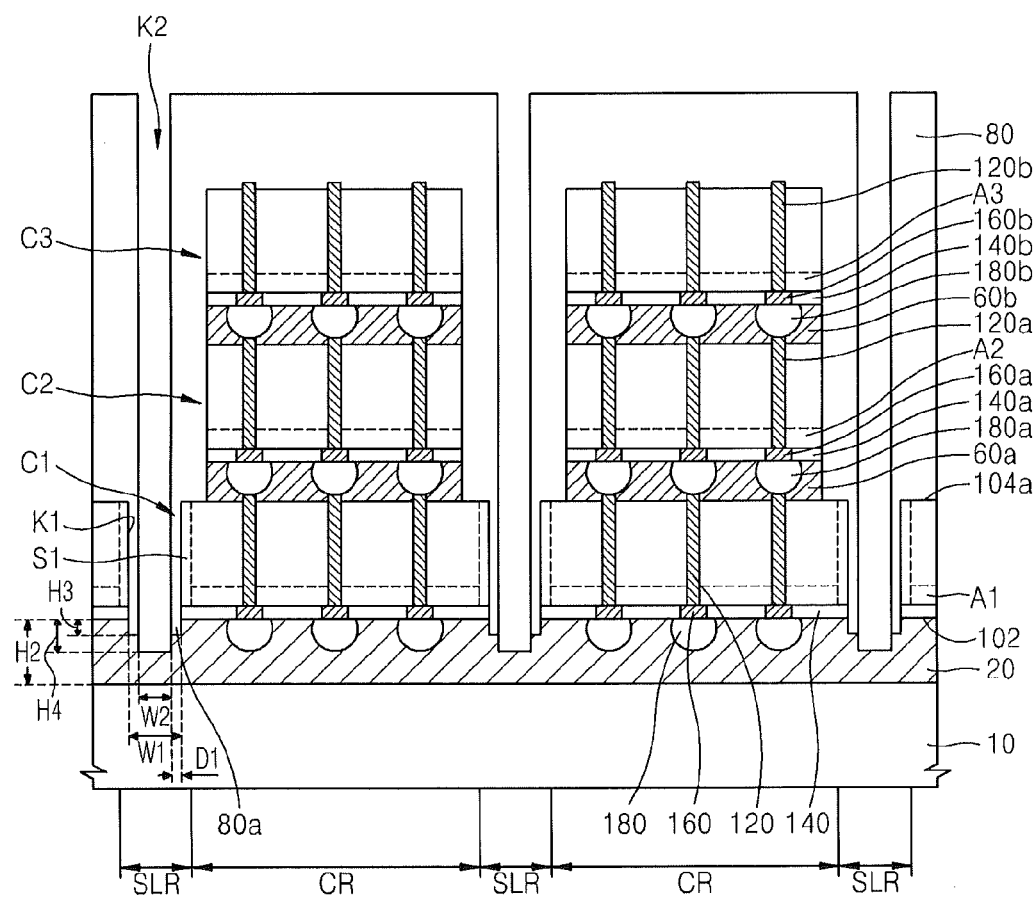

FIG. 17 is a cross-sectional view illustrating an operation of forming the second cutting groove K2 in the semiconductor package 1a, according to an embodiment of the inventive concept.

Referring to FIG. 17, a portion of the molding layer 80 is removed to form the second cutting groove K2. The second cutting groove K2 is formed by removing a portion of the molding layer 80 and/or the adhesive layer 20 such that the first through third semiconductor chips C1, C2, and C3 are not exposed.

In particular, the second cutting groove K2 may be formed such that the second cutting groove K2 does not expose sidewalls of the first cutting groove K1. That is, even when the second cutting groove K2 is formed, the sidewalls of the first cutting groove K1 may be completely covered by the remaining molding layer 80. Accordingly, the second cutting groove K2 may have the second width W2 that is less than the first width W1 of the first cutting groove K1. Also, centers of the second cutting groove K2 and the first cutting groove K1 correspond to each other as much as possible so that the molding layer 80 remains between sidewalls of the second cutting groove K2 and the sidewalls of the first cutting groove K1. In particular, a portion of the molding layer 80 that is filled in the first cutting groove K1 formed in the adhesive layer 20 and remains after the second cutting groove K2 is formed may be a protrusion 80a.

A width D1 of the protrusion 80a of the semiconductor package 1a illustrated in FIG. 1A may correspond to a difference between the first width W1 of the first cutting groove K1 and the second width W2 of the second cutting groove K2 that is divided by half.

The second cutting groove K2 may be formed in the molding layer 80, so as to separate the molding layer 80 into individual molding layers covering one of the plurality of first semiconductor chips C1, corresponding to one of the plurality of second semiconductor chips C2, and corresponding one of the plurality of third semiconductor chips C3.

The second cutting groove K2 may be formed passing through the molding layer 80 so that the corresponding first through third semiconductor chips C1, C2, and C3 form one semiconductor package. That is, singulation, which is separation between semiconductor packages, may be conducted by the second cutting groove K2. Also, the second cutting groove K2 may be formed not to pass through the adhesive layer 20. That is, the support substrate 10 may not be exposed in the second cutting groove K2. Accordingly, the support substrate 10 may be reused after being separated in a subsequent process.

A fourth height H4, which is the depth of the second cutting groove K2 from the first surface 102, may be greater than the third height H3, which is the depth of the first cutting groove K1 from the first surface 102. Also, the fourth height H4 may be less than the second height H2. Accordingly, the fourth height H4 may be greater than at least 5 μm, and less than 200 μm, which is the upper limit of the thickness of the second height H2.

The second cutting groove K2 may be formed by using a blade or laser. The first cutting groove K1 and the second cutting groove K2 may be formed using a blade that forms a wide kerf width or a blade that forms a narrow kerf width, or using both blades. Alternatively, the first cutting groove K1 may be respectively formed using a blade that forms a relatively wide width, and the second cutting groove K2 may be formed using a laser that forms a relatively narrow width.

Next, by removing the support substrate 10 on which the adhesive layer 20 is attached, a plurality of individually separated semiconductor packages 1a, one of which is illustrated in FIG. 1A, may be formed. Accordingly, the first thickness T1, which is the thickness of the protrusion 80a of the semiconductor package 1a illustrated in FIG. 1A, may correspond to the third height H3, which is the depth of the first cutting groove K1 in the adhesive layer 20.

Accordingly, in the semiconductor package 1a illustrated in FIG. 1A, a thin molding layer 80 corresponding to a portion of the scribe lane having a relatively narrow width may be formed. Thus, a semiconductor package that is similar to a chip scale package (CSP) may be formed. Also, a chip volume may be reduced or minimized by forming a stack semiconductor package using through electrodes.

Figure 18:
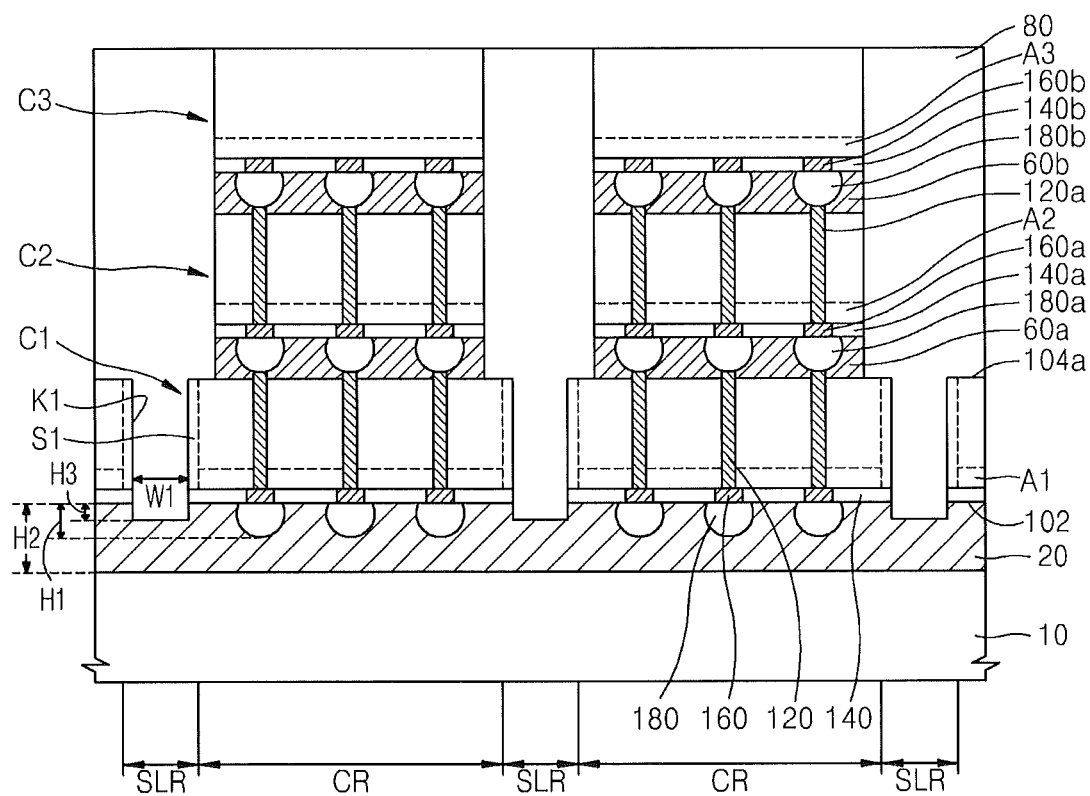
FIGS. 18 and 19 are cross-sectional views illustrating a method of manufacturing the semiconductor package of FIG. 2, which is a modified embodiment of the semiconductor package of FIG. 1, according to an embodiment of the inventive concept.
Figure 19:
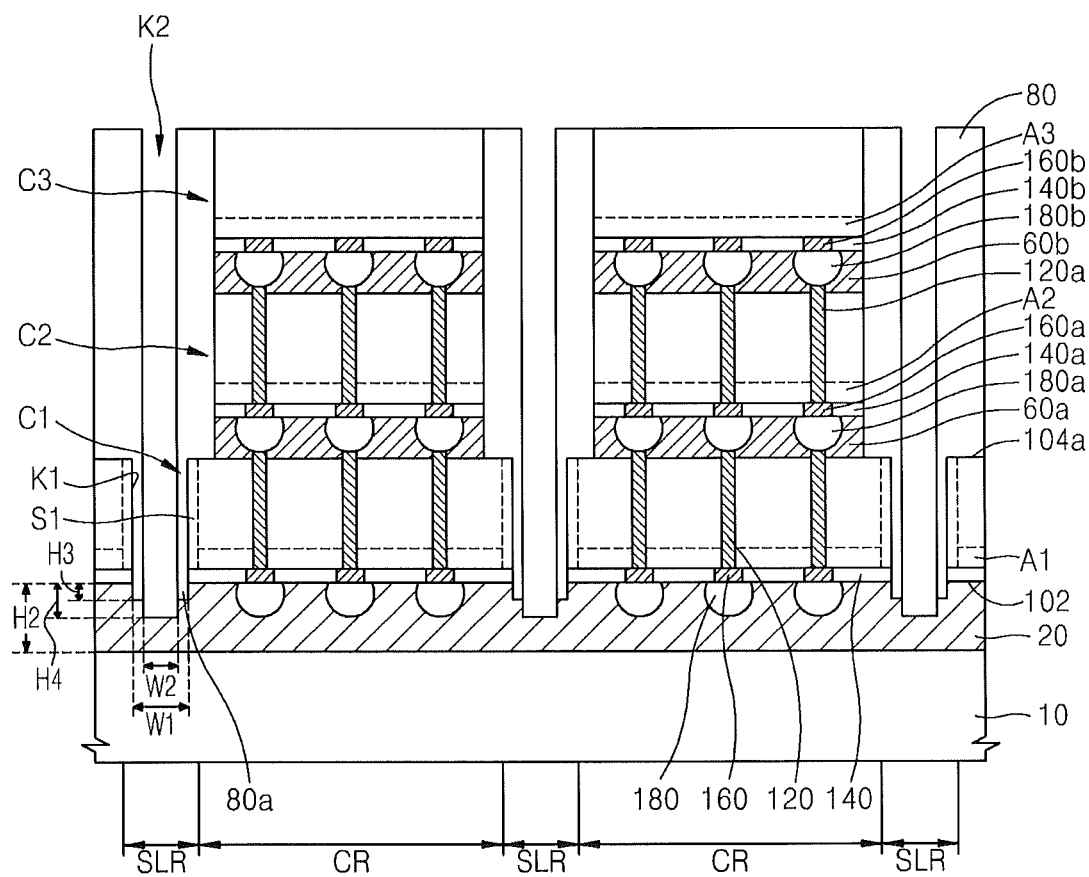

FIGS. 18 and 19 are cross-sectional views illustrating a method of manufacturing the semiconductor package of FIG. 2, which is a modified embodiment of the semiconductor package of FIG. 1, according to an embodiment of the inventive concept.

FIG. 18 is a cross-sectional view illustrating an operation of forming the molding layer 80 in the modified embodiment of the semiconductor package 1a of the inventive concept, according to an embodiment of the inventive concept. FIG. 18 illustrates a method of manufacturing the semiconductor package 1b after the operations of the method of forming the semiconductor package 1a of FIGS. 8 through 15 are performed, but is different hereafter in terms of the structure of the third semiconductor chip C3.

Referring to FIG. 18, the molding layer 80 is formed to surround the first through third semiconductor chips C1, C2, and C3. The molding layer 80 may be formed so as to completely fill the first cutting groove K1. The molding layer 80 may include, for example, EMC or ceramic material.

The molding layer 80 completely covers the first and second semiconductor chips C1 and C2 but may expose a portion of the third semiconductor chip C3. That is, a surface of the third semiconductor chip C3 opposite to the third active area A3 may be exposed at the molding layer 80.

Unlike the third semiconductor chip C3 illustrated in FIGS. 8 through 15, the third semiconductor chip C3 illustrated in FIG. 18 may not include a through electrode. However, when a device that requires an additional power source (e.g., a thermoelectric device) is attached to the exposed surface of the third semiconductor chip C3 in a subsequent operation, the third semiconductor chip C3 may include the third through electrode 120b, like the third semiconductor chip C3 illustrated in FIGS. 8 through 15.

FIG. 19 is a cross-sectional view illustrating an operation of forming a second cutting groove K2 in the molding layer 80 formed in the operation described with reference to FIG. 18.

Referring to FIG. 19, a portion of the molding layer 80 is removed to form the second cutting groove K2. The second cutting groove K2 may be formed by removing a portion of the molding layer 80 and/or the adhesive layer 20 such that the first through third semiconductor chips C1, C2, and C3 are not exposed.

In particular, the second cutting groove K2 may be formed so as not to expose sidewalls of the first cutting groove K1. Accordingly, the second cutting groove K2 may be formed to have a second width W2 that is narrower than the first width W1 of the first cutting groove K1.

A portion of the molding layer 80 that is filled in the first cutting groove K1 formed in the adhesive layer 20 and remains after the second cutting groove K2 is formed may be a protrusion 80a.

Next, by removing the support substrate 10 on which the adhesive layer 20 is attached, a plurality of individually separated semiconductor packages 1b, one of which is illustrated in FIG. 2, may be formed. Accordingly, the first thickness T1, which is the thickness of the protrusion 80a of the semiconductor package 1b illustrated in FIG. 2, may correspond to the third height H3, which is the depth of the first cutting groove K1 in the adhesive layer 20.

FIGS. 20 through 24 are cross-sectional views illustrating a method of manufacturing the semiconductor package 1c according to an embodiment of the inventive concept. FIGS. 20 through 24 illustrate operations performed after the operations of the method described with reference to FIGS. 8 through 12. Accordingly, the method of manufacturing the semiconductor package 1c, according to the present embodiment of the inventive concept, corresponds to the method described with reference to FIGS. 8 through 12.

Figure 20:
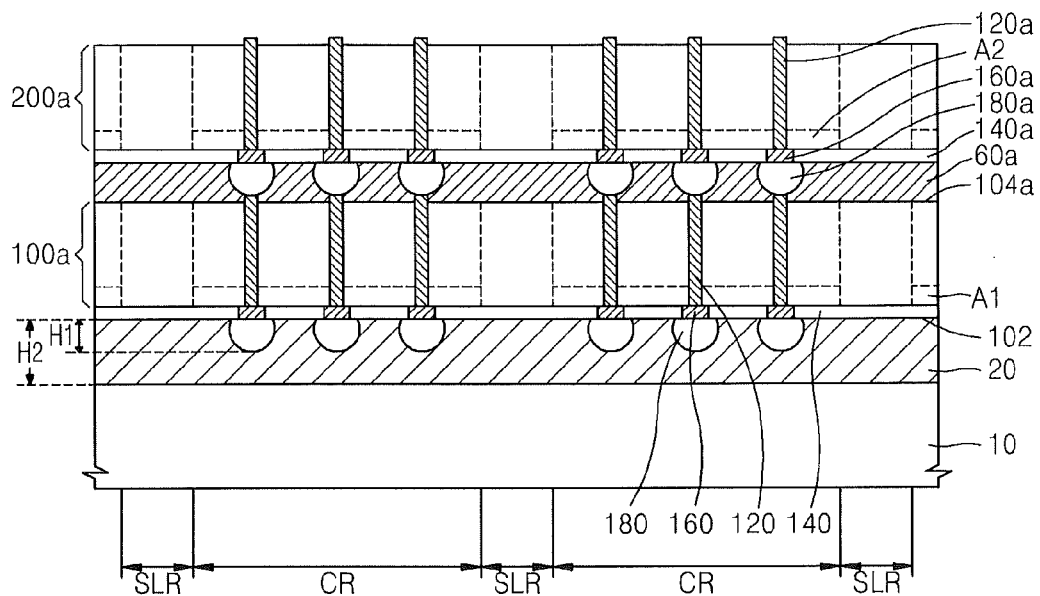
FIGS. 20 through 24 are cross-sectional views illustrating a semiconductor package of FIG. 3 according to an embodiment of the inventive concept.

FIG. 20 is a cross-sectional view illustrating an operation of attaching a second semiconductor substrate 200a to the first semiconductor substrate 100a in the method according to the present embodiment of the inventive concept.

Referring to FIG. 20, the second semiconductor substrate 200a is attached on the first semiconductor substrate 100a. The second semiconductor substrate 200a may be the same type of semiconductor substrate as the first semiconductor substrate 100a. That is, the same type of individual semiconductor devices may be formed in the second semiconductor substrate 200a as in the first semiconductor substrate 100a, and the second semiconductor substrate 200a may include chip regions CR and chip cutting regions SLR having the same surface areas as those of the first semiconductor substrate 100a. The chip regions CR and the chip cutting regions SLR of the first semiconductor substrate 100a may also be referred to as first chip regions and first chip cutting regions, respectively.

The method of manufacturing the second semiconductor substrate 200a may correspond to the method of manufacturing the first semiconductor substrate 100a described with reference to FIGS. 8 through 12. That is, two semiconductor substrates are formed according to the method of manufacturing the first semiconductor substrate 100a described with reference to FIGS. 8 through 12. Then, while having one semiconductor substrate being attached on the support substrate 10, the one semiconductor substrate is separated from the other semiconductor substrate. The adhesive layer 20 is also separated from the other semiconductor substrate. In this case, the one semiconductor substrate may correspond to the first semiconductor substrate 100a, and the other semiconductor substrate may correspond to the second semiconductor substrate 200a.

However, the method of manufacturing the second semiconductor substrate 200a is not limited thereto, and may be any method that can be selected by one of ordinary skill in the art without departing from the technical scope of the inventive concept.

Description of the second active area A2, the second connection bumps 180a, the second through electrode 120a, the second protection layer 140a, and the second pad 160a included in the second semiconductor chip C2 is not mentioned here and may respectively correspond to the description of the first active area A1, the first connection bumps 180, the first through electrode 120, the first protection layer 140, and the first pad 160 included in the first semiconductor chip C1.

The second semiconductor substrate 200a may be aligned and attached on the first semiconductor substrate 100a such that chip regions CR and chip cutting regions SLR of the first semiconductor substrate 100a and the second semiconductor substrate 200a respectively correspond to each other.

The second connection bumps 180a of the second semiconductor substrate 200a may contact the first semiconductor substrate 100a so as to correspond to the first through electrodes 120a of the first semiconductor substrate 100a. Thus, the second connection bumps 180a and the first through electrodes 120a may be electrically connected to each other.

Also, a first filler material layer 60a may be formed between the first semiconductor substrate 100a and the second semiconductor substrate 200a. Alternatively, the first filler material layer 60a may be formed of the same material as the molding layer 80, which will be described later. When the first filler material layer 60a and the molding layer 80 are formed together, the first filler material layer 60a may be a portion of the molding layer 80.

Figure 21:
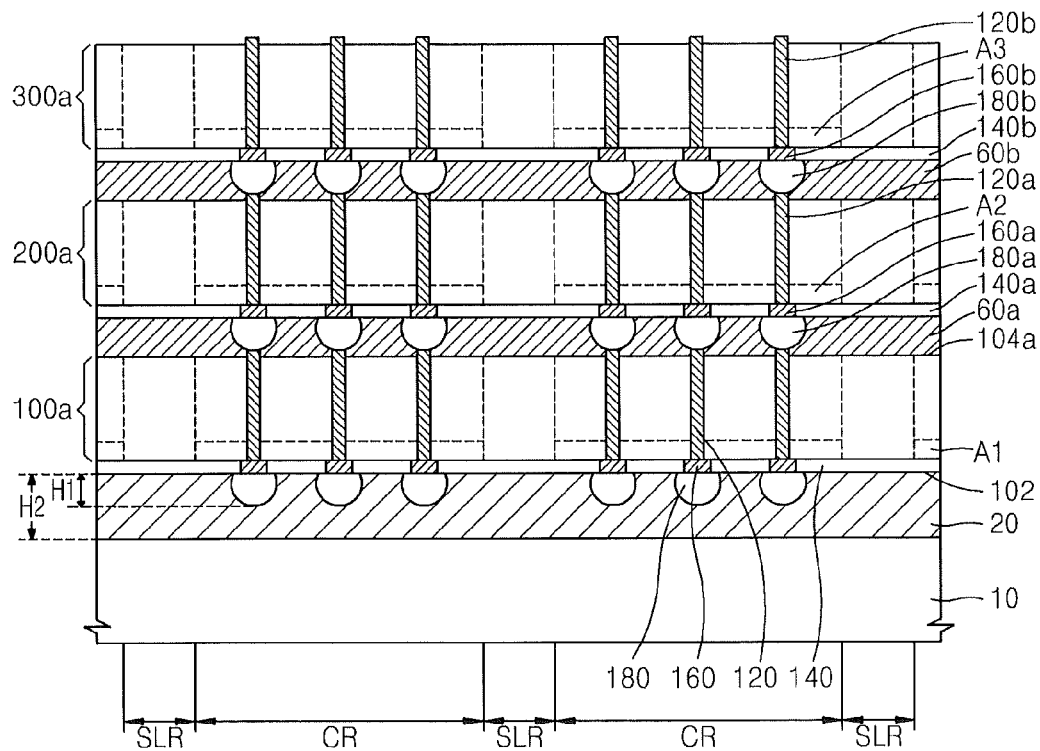

FIG. 21 is a cross-sectional view illustrating an operation of attaching a third semiconductor substrate 300a to the second semiconductor substrate 200a in the method according to the present embodiment of the inventive concept.

Referring to FIG. 21, the third semiconductor substrate 300a is attached on the second semiconductor substrate 200a, which is attached on the first semiconductor substrate 100a.

The third semiconductor substrate 300a may be attached on the second semiconductor substrate 200a in the same manner that the second semiconductor substrate 200a is attached on the first semiconductor substrate 100a, which is described with reference to FIG. 20.

Figure 22:
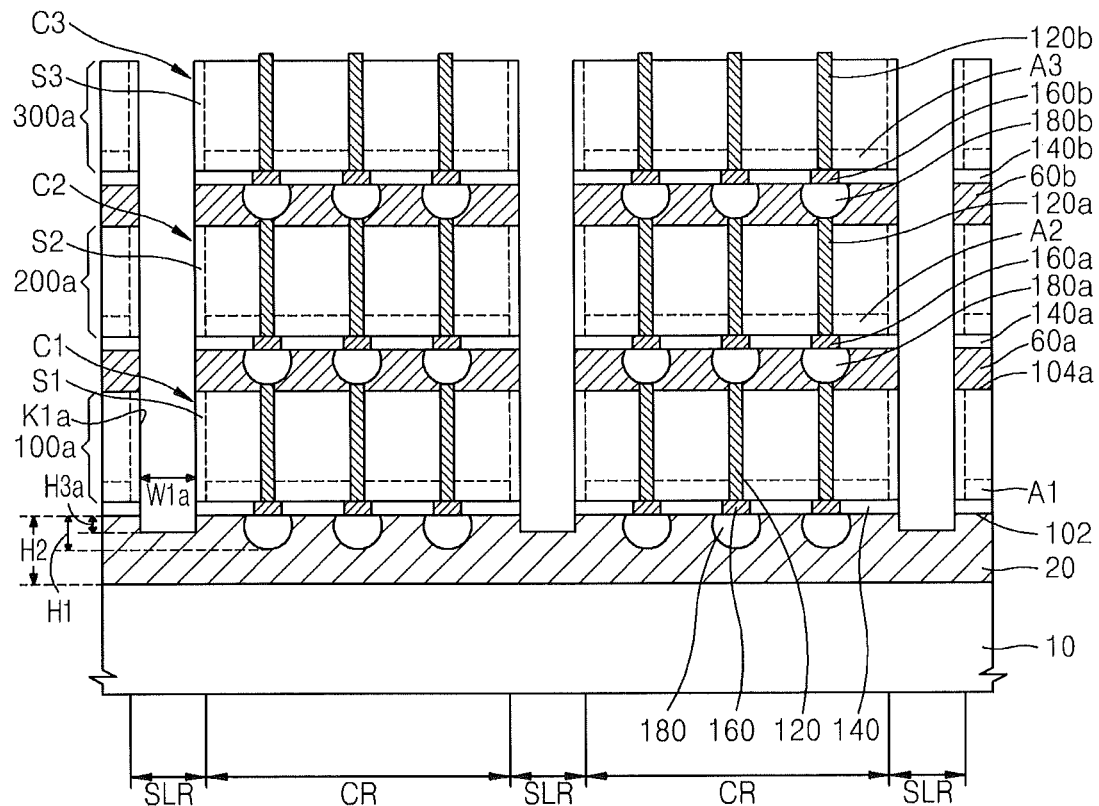

FIG. 22 is a cross-sectional view illustrating an operation of forming a first cutting groove K1a in the method according to the present embodiment of the inventive concept.

Referring to FIG. 22, the first cutting groove K1a is formed in the first through third semiconductor substrates 100a, 200a, and 300a to separate the first through third semiconductor substrates 100a, 200a, and 300a into first through third semiconductor chips C1, C2, and C3, respectively. The first cutting groove K1a may be formed by removing a portion of the chip cutting regions SLR of the first through third semiconductor substrates 100a, 200a, and 300a. The first cutting groove K1a may be formed by removing a portion of the chip cutting regions SLR of the first through third semiconductor substrates 100a, 200a, and 300a and a portion of the adhesive layer 20 in the chip cutting regions SLR of the first semiconductor substrate 100a at the same time. The first cutting groove K1a may be formed using a blade or laser.

After the portions of the chip cutting regions SLR of the first through third semiconductor substrates 100a, 200a, and 300a are removed by forming the first cutting groove K1, remaining portions of the chip cutting regions SLR surrounding the chip regions CR of the first through third semiconductor substrates 100a, 200a, and 300a may be referred to as first through third remaining scribe lanes S1, S2, and S3, respectively.

The first cutting groove K1a may be formed by removing only a portion of the adhesive layer 20 such that the support substrate 10 is not exposed. The first cutting groove K1a may be formed by removing a portion of the adhesive layer 20 to the third height H3a with respect to the first semiconductor substrate 100a. Accordingly, the third height H3a may be less than the first height H1. The third height H3a may be, for example, about 5 to 20 μm.

Also, the third height H3a may be less than the second height H2. Accordingly, the first cutting groove K1a may be formed by removing the adhesive layer 20 to a depth between the first surface 102 of the first semiconductor substrate 100a and an uppermost surface of the first connection bumps 180.

The first through third semiconductor chips C1, C2, and C3 may be formed of chip regions CR of the first through third semiconductor substrates 100a, 200a, and 300a and first through third remaining scribe lanes S1, S2, and S3 surrounding the chip regions CR, respectively.

Figure 23:
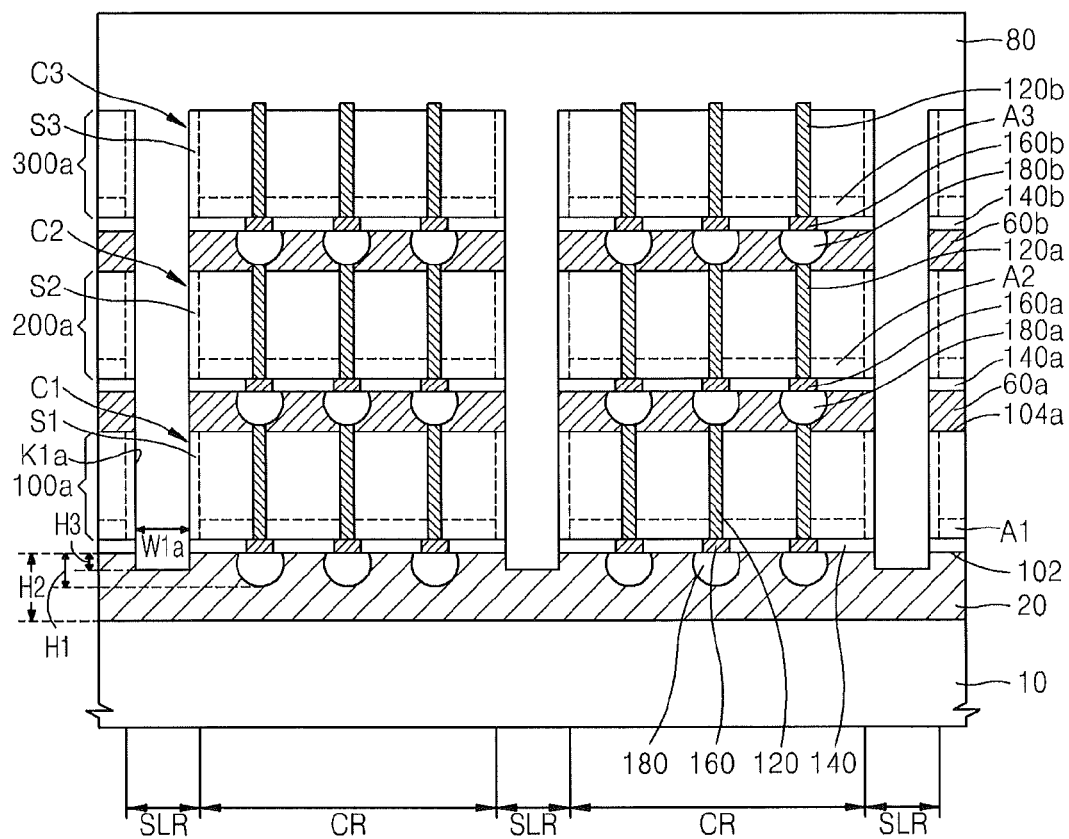

FIG. 23 is a cross-sectional view illustrating an operation of forming the molding layer 80 in the method according to the present embodiment of the inventive concept.

Referring to FIG. 23, the molding layer 80 is formed to completely cover the first through third semiconductor chips C1, C2, and C3. The molding layer 80 may be formed so as to completely fill the first cutting groove K1a. For example, the molding layer 80 may include EMC or ceramic material.

As described above, the first under-fill material layer 60a may be formed separately in a previous operation or may be formed together as a portion of the molding layer 80. Likewise, the second under-fill material layer 60b may be formed separately in a previous operation or may be formed together as a portion of the molding layer 80.

Figure 24:
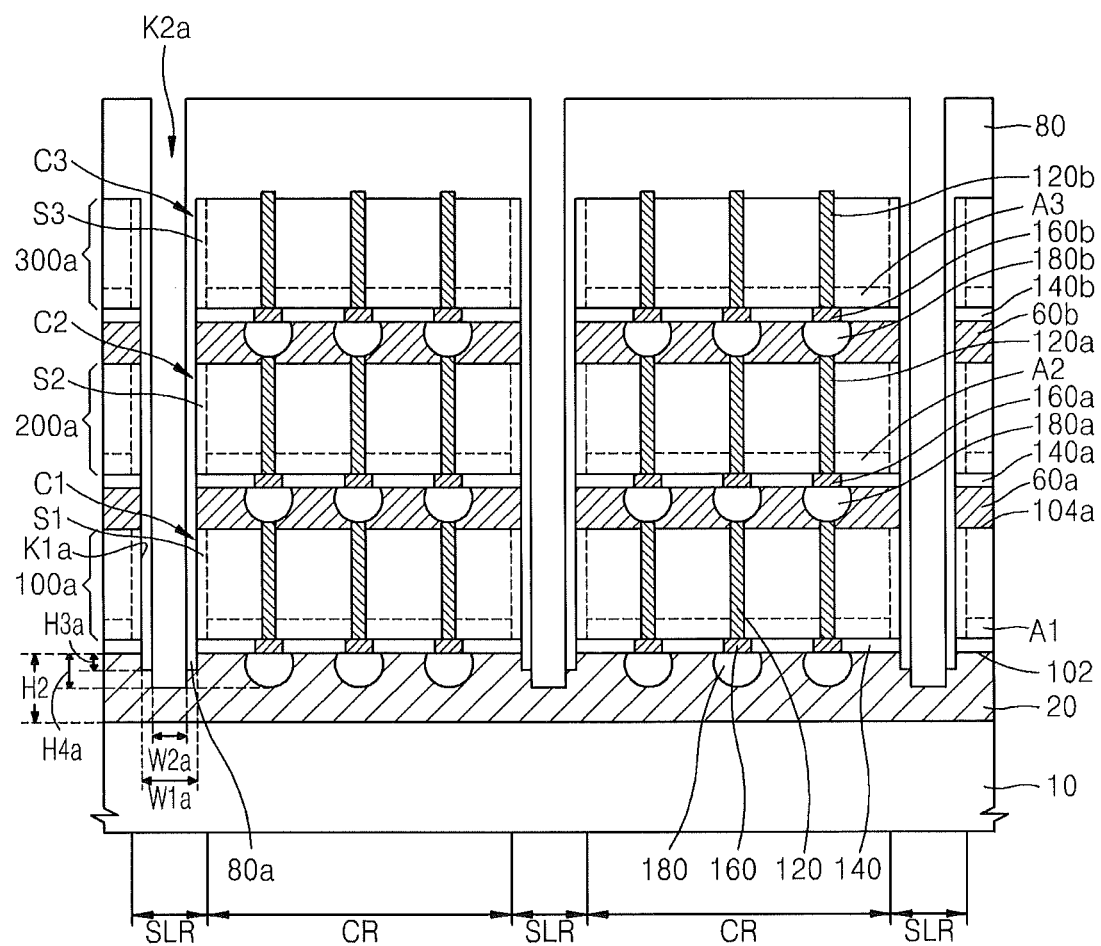

FIG. 24 is a cross-sectional view illustrating an operation of forming a second cutting groove K2a in the method according to the present embodiment of the inventive concept.

Referring to FIG. 24, the second cutting groove K2a is formed by removing a portion of the molding layer 80. The second cutting groove K2a may be formed by removing a portion of the molding layer 80 and/or the adhesive layer 20 such that the first through third semiconductor chips C1, C2, and C3 are not exposed.

A fourth height H4a, which is the depth of the second cutting groove K2a from the first surface 102, may be greater than the above-described third height H3a. Also, the fourth height H4a may be less than the second height H2. Accordingly, the fourth height H4a may be greater than at least about 5 μm and less than about 200 μm, which is the upper limit of the thickness of the second height H2.

In particular, the second cutting groove K2a may be formed so as not to expose sidewalls of the first cutting groove K1a. Thus, the second cutting groove K2a may be formed to have a second width W2a that is narrower than the first width W1a of the first cutting groove K1a. Also, centers of the second cutting groove K2 and the first cutting groove K1 correspond to each other as much as possible so that the molding layer 80 remains between the sidewalls of the second cutting groove K2 and the first cutting groove K1. In particular, portions of the molding layer 80 that is filled in the first cutting groove K1 formed in the adhesive layer 20 and remains after the second cutting groove K2 is formed may be a protrusion 80a.

The second cutting groove K2a may be formed passing through the molding layer 80 such that the corresponding first through third semiconductor chips C1, C2, and C3 form one semiconductor package. The second cutting groove K2a may be formed using a blade or laser.

Next, by removing the support substrate 10 on which the adhesive layer 20 is attached, a plurality of individually separated semiconductor packages 1c, one of which is illustrated in FIG. 3, may be formed. Accordingly, the first thickness T1, which is the thickness of the protrusion 80a of the semiconductor package 1c illustrated in FIG. 3, may correspond to the third height H3a, which is the depth of the first cutting groove K1a in the adhesive layer 20.

Figure 25:
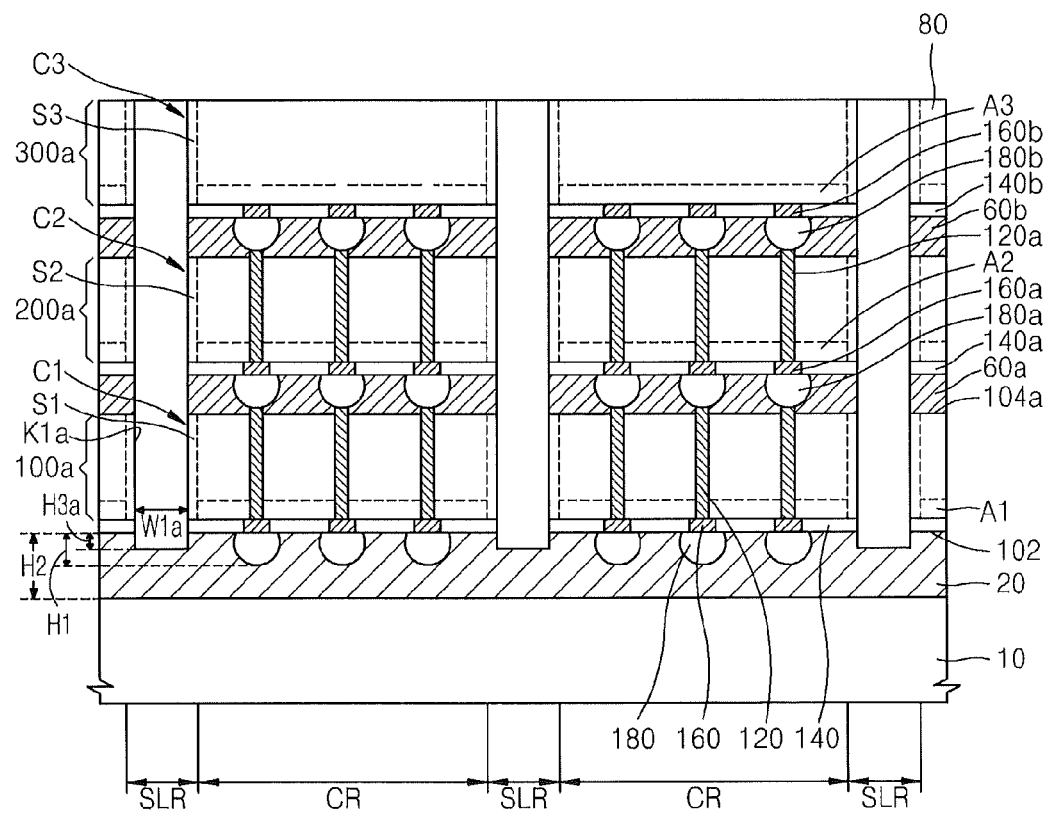
FIGS. 25 and 26 are cross-sectional views illustrating a method of manufacturing the semiconductor package of FIG. 4, according to an embodiment of the inventive concept.
Figure 26:
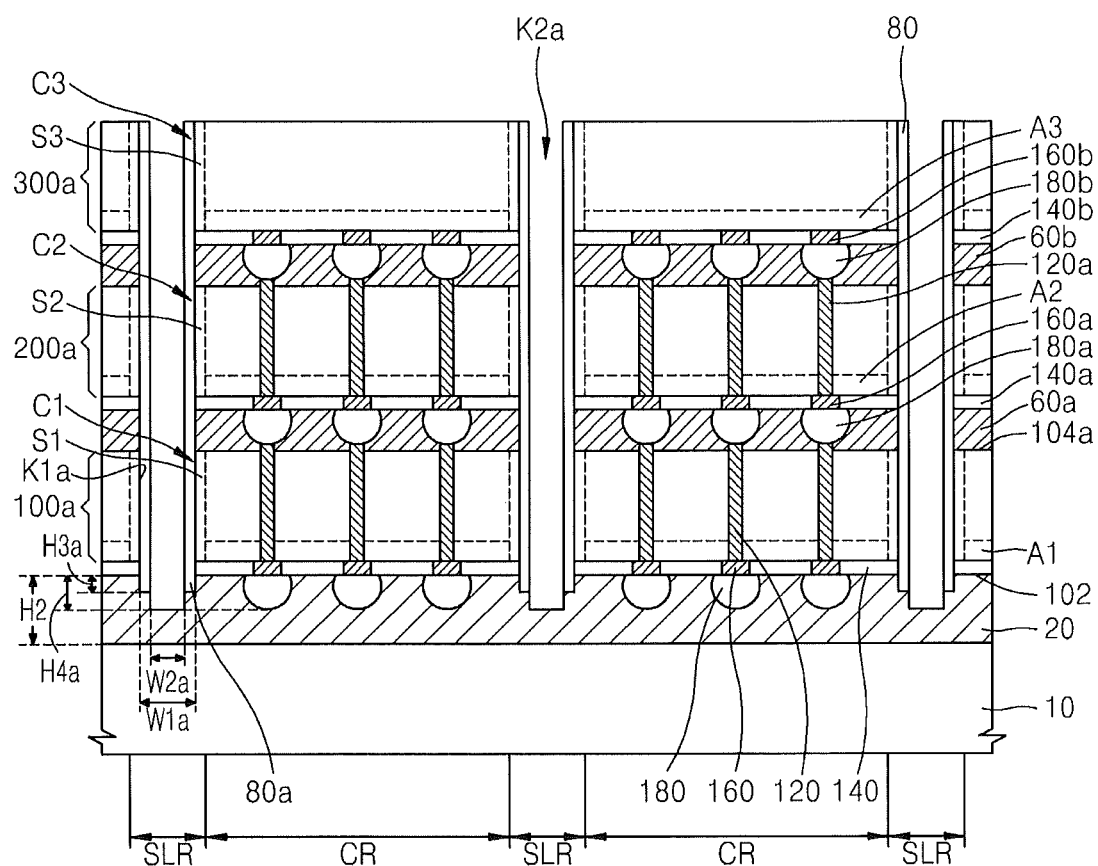

FIGS. 25 and 26 are cross-sectional views illustrating a method of manufacturing the semiconductor package 1d, according to another embodiment of the inventive concept.

FIG. 25 is a cross-sectional view illustrating an operation of forming a molding layer 80 in the method according to the present embodiment of the inventive concept. FIG. 25 illustrates the method of manufacturing the semiconductor package 1d after the operations of the method of forming the semiconductor package 1c of FIGS. 20 through 22 are performed, but is different hereafter in terms of the structure of the third semiconductor chip C3.

Referring to FIG. 25, a molding layer 80 is formed to surround the first through third semiconductor chips C1, C2, and C3. The molding layer 80 may be formed so as to completely fill the first cutting groove K1a. The molding layer 80 may include, for example, EMC or ceramic material.

The molding layer 80 completely covers the first and second semiconductor chips C1 and C2, but may expose a portion of the third semiconductor chip C3. That is, a surface of the third semiconductor chip C3 opposite to the third active area A3 may be exposed at the molding layer 80.

Unlike the third semiconductor chip C3 illustrated in FIGS. 20 through 22, the third semiconductor chip C3 illustrated in FIG. 25 may not include a through electrode.

FIG. 26 is a cross-sectional view illustrating an operation of forming a second cutting groove K2a in the method according to the present embodiment of the inventive concept.

Referring to FIG. 26, a portion of the molding layer 80 is removed to form the second cutting groove K2a. The second cutting groove K2a may be formed by removing a portion of the molding layer 80 and/or the adhesive layer 20 such that the first through third semiconductor chips C1, C2, and C3 are not exposed.

In particular, the second cutting groove K2a may be formed so as not to expose sidewalls of the first cutting groove K1a. Accordingly, the second cutting groove K2a may be formed to have a second width W2a that is narrower than the first width W1a of the first cutting groove K1a.

A portion of the molding layer 80 that is filled in the first cutting groove K1a formed in the adhesive layer 20 and remains after the second cutting groove K2a is formed may be a protrusion 80a.

Next, by removing the support substrate 10 on which the adhesive layer 20 is attached, a plurality of individually separated semiconductor packages 1d, one of which is illustrated in FIG. 4, may be formed. Accordingly, the first thickness T1, which is the thickness of the protrusion 80a of the semiconductor package 1d illustrated in FIG. 4, may correspond to the third height H3a, which is the depth of the first cutting groove K1a in the adhesive layer 20.

FIGS. 27 through 31 are cross-sectional views illustrating a method of manufacturing the semiconductor package 1f, according to an embodiment of the inventive concept. Description of the method according to the present embodiment described with reference to FIGS. 27 through 31 is not included here and may correspond to the description of the method according to the embodiment described with reference to FIGS. 13 through 17.

Figure 27:
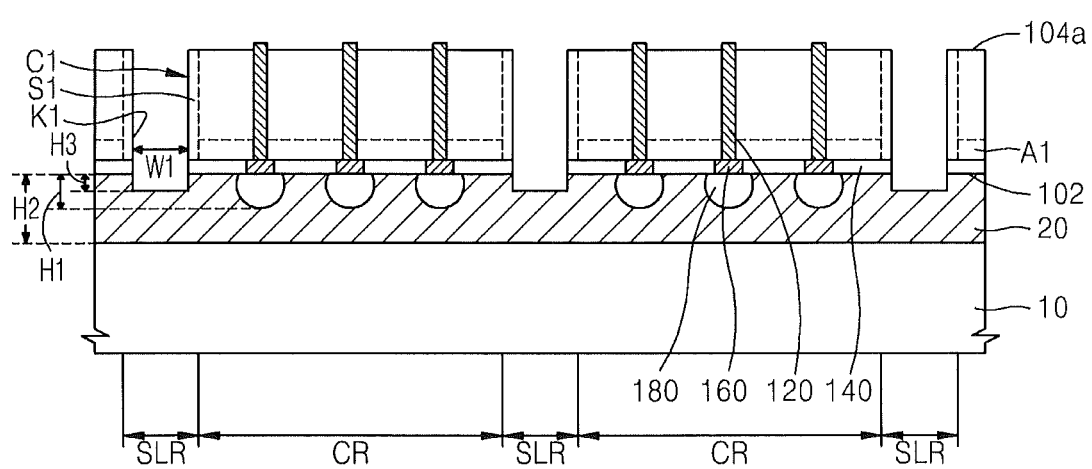
FIGS. 27 through 31 are cross-sectional views illustrating a method of manufacturing the semiconductor package of FIG. 6 according to an embodiment of the inventive concept.

FIG. 27 is a cross-sectional view illustrating an operation of forming a first cutting groove K1 in the method according to the present embodiment of the inventive concept. FIG. 27 illustrates an operation performed after the method of manufacturing a semiconductor package described with reference to FIGS. 8 through 12.

Referring to FIGS. 27 and 12, the first cutting groove K1 is formed in the first semiconductor substrate 100a to separate the first semiconductor substrate 100a into a plurality of first semiconductor chips C1. The first cutting groove K1 may be formed by removing a portion of the chip cutting regions SLR of the first semiconductor substrate 100a. The first cutting groove K1 may be formed by removing a portion of the chip cutting regions SLR of the first semiconductor substrate 100a and a portion of the adhesive layer 20 in the chip cutting regions SLR. The first cutting groove K1 may be formed using a blade or laser.

The first cutting groove K1 may be formed by removing only a portion of the adhesive layer 20 such that the support substrate 10 is not exposed. The first cutting groove K1 may be formed by removing a portion of the adhesive layer 20 to the third height H3 with respect to the first semiconductor substrate 100a. Accordingly, the third height H3 may be less than the first height H1. For example, the third height H3 may be about 5 to about 20 μm. Also, the third height H3 may be the depth of the removed portion of the adhesive layer 20.

The first cutting groove K1 may be formed to have the first width W1. The first width W1 of the first cutting groove K1 may be less than the width of the chip cutting region SLR of the first semiconductor substrate 100a. Accordingly, after forming the first cutting groove K1, in addition to the chip region CR of the first semiconductor substrate 100a, a first remaining scribe lane region S1, which is a remaining portion of the chip cutting region SLR, may be included in the first semiconductor chip C1.

Figure 28:
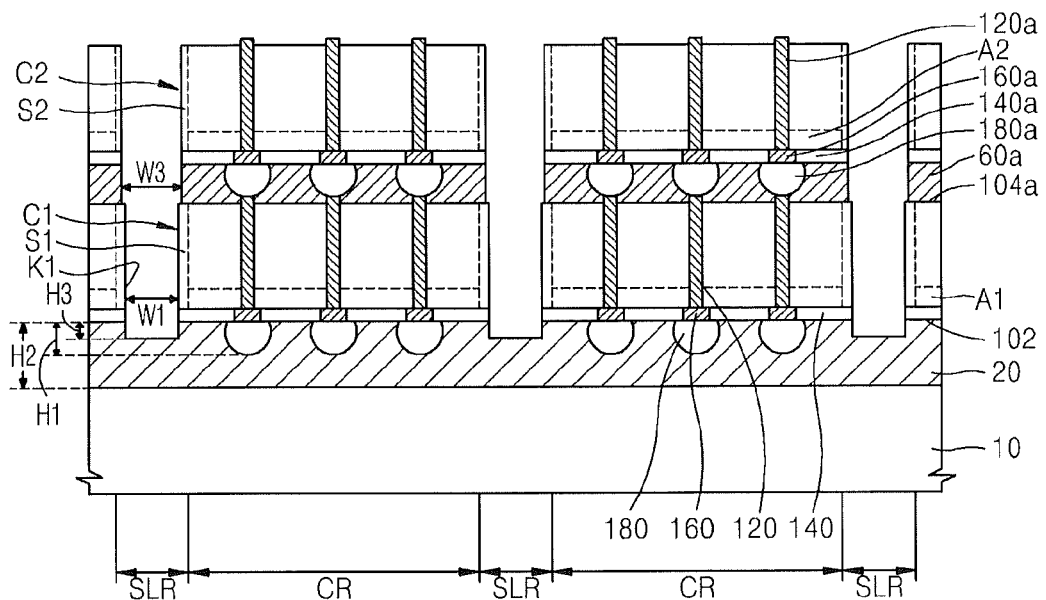

FIG. 28 is a cross-sectional view illustrating an operation of attaching second semiconductor chips C2 on the first semiconductor chips C1 in the method according to the present embodiment of the inventive concept.

Referring to FIG. 28, the second semiconductor chips C2 are attached on the separated first semiconductor chips C1. The second semiconductor chips C2 may be attached to correspond to the first semiconductor chips C1, respectively. The second semiconductor chips C2 may be stacked on the first semiconductor chips C1 such that portions of the second surface 104a of the first semiconductor chips C1 are exposed.

That is, the second semiconductor chips C2 may have smaller chip surface areas than those of the first semiconductor chips C1.

Referring to FIGS. 13 and 28, the chip surface areas of the second semiconductor chips C2 illustrated in FIG. 13 may be smaller than those of the chip surface areas of the chip regions CR of the first semiconductor chips C1. However, the chip surface areas of the second semiconductor chips C2 illustrated in FIG. 28 may be greater than those of the chip regions CR of the first semiconductor chips C1.

In detail, the second semiconductor chips C2 in the method according to the present embodiment described with reference to FIG. 27 have chip regions having the same surface areas as those of the first semiconductor chips C1. Also, the second semiconductor chips C2 further include second remaining scribe lane regions S2.

That is, the second semiconductor chip C2 may be formed by separating the same type of semiconductor substrate having the same size as the first semiconductor chip C1. However, the second semiconductor chip C2 may be formed to have a third width that is greater than the first width W1 by separating the semiconductor substrate of the same type. Accordingly, when the second semiconductor chip C2 is attached on the first semiconductor chip C1, a distance W3 may be formed between the second semiconductor chips C2.

Accordingly, when forming a semiconductor package according to the method of the present embodiment of the inventive concept by stacking semiconductor chips of the same type, the surface area of the second remaining scribe lane region S2 of the second semiconductor chip C2 attached on the first semiconductor chip C1 may be less than the surface area of the first remaining scribe lane region S1 of the first semiconductor chip C1.

Figure 29:
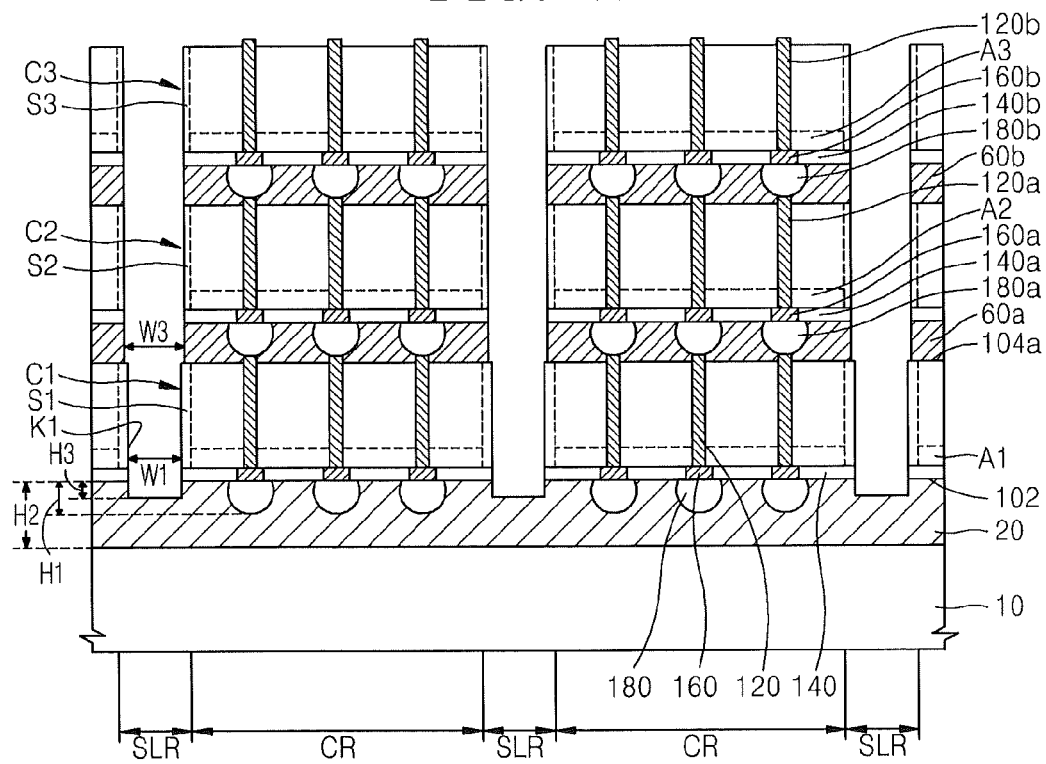

FIG. 29 is a cross-sectional view illustrating an operation of attaching third semiconductor chips C3 to the second semiconductor chips C2 in the method according to the present embodiment of the inventive concept.

Referring to FIG. 29, the third semiconductor chips C3 are respectively attached on the second semiconductor chips C2 that are stacked on the first semiconductor chips C1. Description of the connection between the second semiconductor chips C2 and the third semiconductor chips C3 is not mentioned here and may correspond to the description of the connection between the first semiconductor chips C1 and the second semiconductor chips C2.

Figure 30:
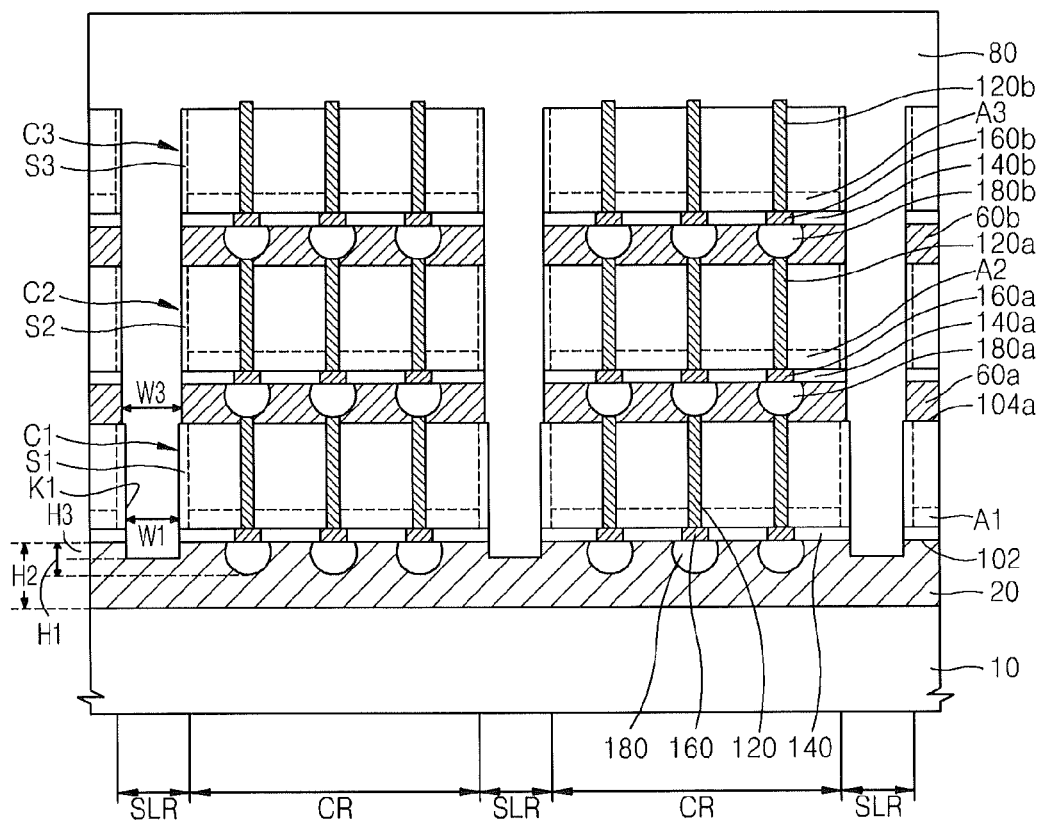

FIG. 30 is a cross-sectional view illustrating an operation of forming a molding layer 80 in the method according to the present embodiment of the inventive concept.

Referring to FIG. 20, a molding layer 80 is formed to completely cover the first through third semiconductor chips C1, C2, and C3. The molding layer 80 may be formed to completely fill the first cutting groove K1. The molding layer 80 may include, for example, an EMC or ceramic material.

Figure 31:
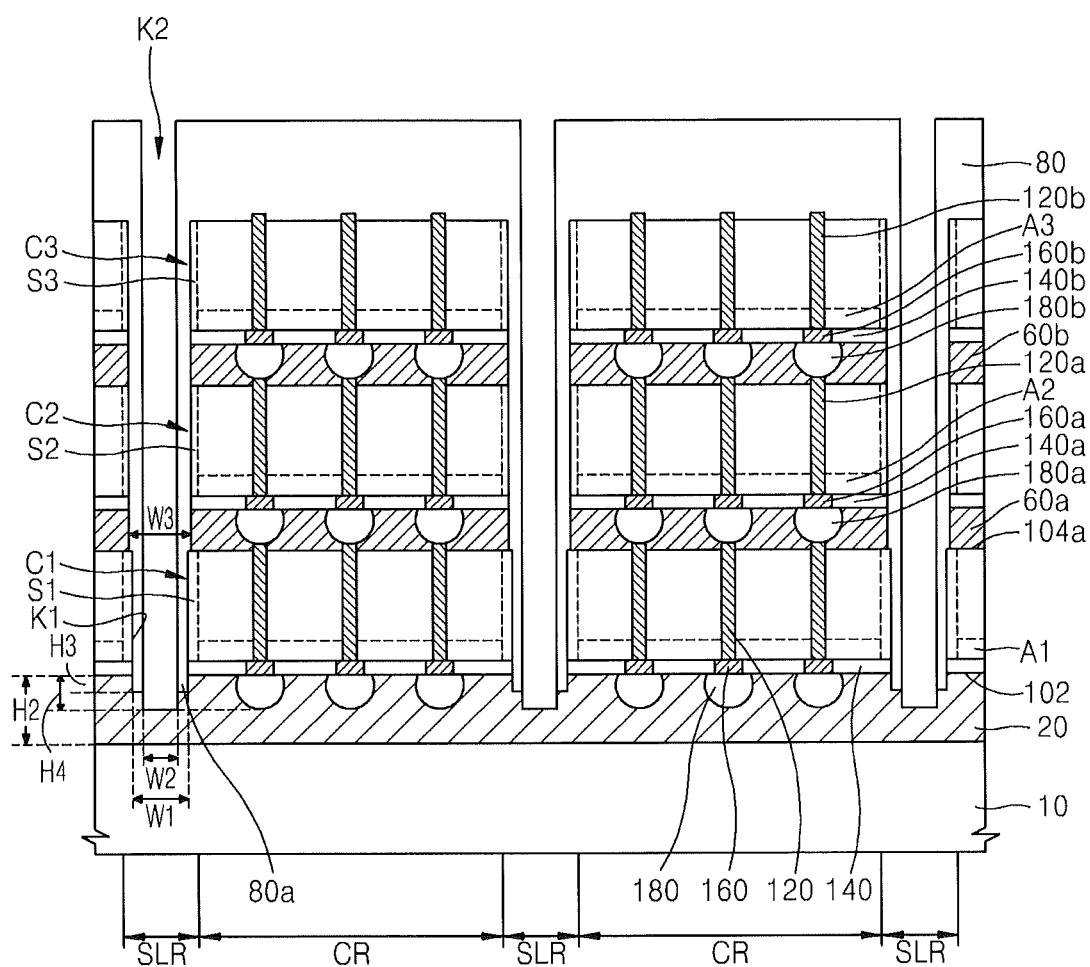

FIG. 31 is a cross-sectional view illustrating an operation of forming a second cutting groove K2 in the method according to the present embodiment of the inventive concept.

Referring to FIG. 31, the second cutting groove K2 is formed by removing a portion of the molding layer 80. The second cutting groove K2 may be formed by removing a portion of the molding layer 80 and/or the adhesive layer 20 such that the first through third semiconductor chips C1, C2, and C3 are not exposed.

Then, by removing the support substrate 10 attached to the adhesive layer 20, a plurality of individually separated semiconductor packages 1f, one of which is illustrated in FIG. 6, may be formed.

Figure 32:
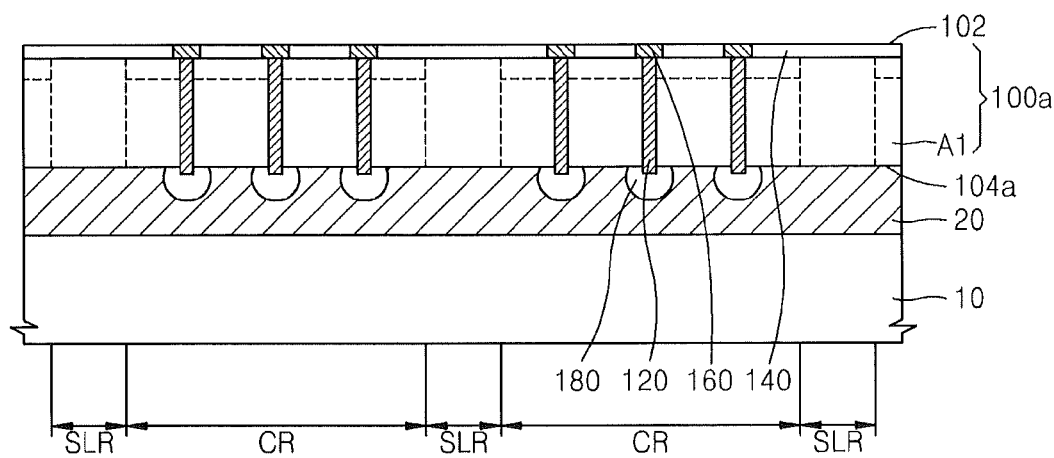
FIGS. 32 through 34 are cross-sectional views illustrating a method of manufacturing the semiconductor package of FIG. 7 according to an embodiment of the inventive concept.
Figure 33:
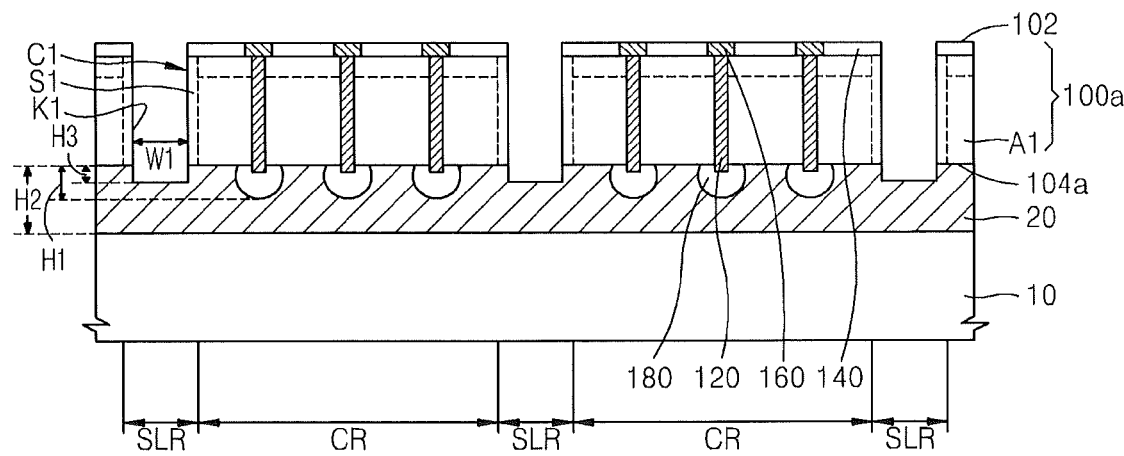
Figure 34:
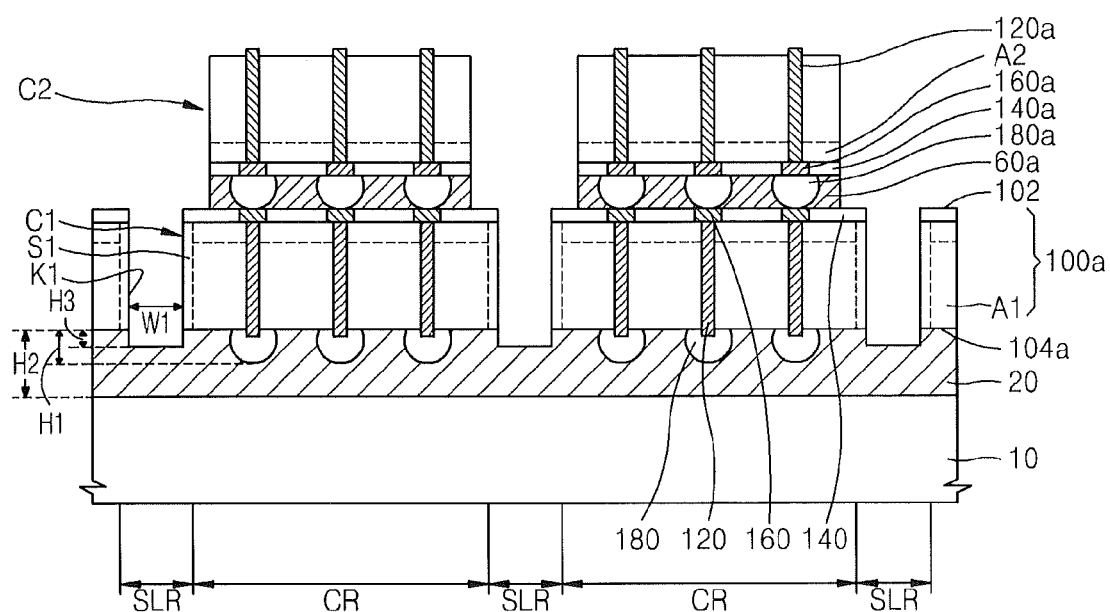

FIGS. 32 through 34 are cross-sectional views illustrating a method of manufacturing a semiconductor package 1g, according to an embodiment of the inventive concept.

FIG. 32 is a cross-sectional view illustrating an operation of attaching a first semiconductor substrate 100a to a support substrate 10 in the method according to the present embodiment of the inventive concept.

Referring to FIG. 32, the first semiconductor substrate 100a is attached on the support substrate 10 using the adhesive layer 20. The first surface 102 of the first semiconductor substrate 100a may be disposed facing the adhesive layer 20 formed on the support substrate 10.

Accordingly, the first semiconductor substrate 100a may have a face-up form where the first surface 102, which is an active surface, faces upward. A back-lap process may be performed on the first semiconductor substrate 100a before the first semiconductor substrate 100a is attached to the support substrate 10.

FIG. 33 is a cross-sectional view illustrating an operation of forming a first cutting groove K1 in the method according to the present embodiment of the inventive concept.

Referring to FIG. 33, the first cutting groove K1 is formed in the first semiconductor substrate 100a to separate the first semiconductor substrate 100a into a plurality of first semiconductor chips C1. The first cutting groove K1 may be formed by removing a portion of the chip cutting region SLR of the first semiconductor substrate 100a. The first cutting groove K1 may be formed by removing a portion of the chip cutting region SLR of the first semiconductor substrate 100a and a portion of the adhesive layer 20 in the chip cutting region SLR.

FIG. 34 is a cross-sectional view illustrating an operation of attaching a second semiconductor chip C2 on the first semiconductor substrate 100a in the method according to the present embodiment of the inventive concept.

Referring to FIG. 34, the second semiconductor chip C2 is stacked on the first semiconductor chip C1. The second semiconductor chip C2 may be attached such that second connection bumps 180a face the first surface 102 of the first semiconductor substrate 100a. In the second semiconductor chip C2, the second connection bumps 180a may be attached on an active surface of the second active area A2. In this case, the first semiconductor substrate 100a and the second semiconductor chip C2 may have a face-to-face form in which respective active surfaces face each other.

Description of the method of manufacturing the semiconductor package according to the present embodiment described with reference to FIGS. 32 through 34 is not mentioned here and may correspond to the method of manufacturing the semiconductor package according to the embodiment described with reference to FIGS. 13 through 17. Accordingly, the semiconductor packages 1g, one of which is illustrated in FIG. 7, may be formed.

Figure 35:
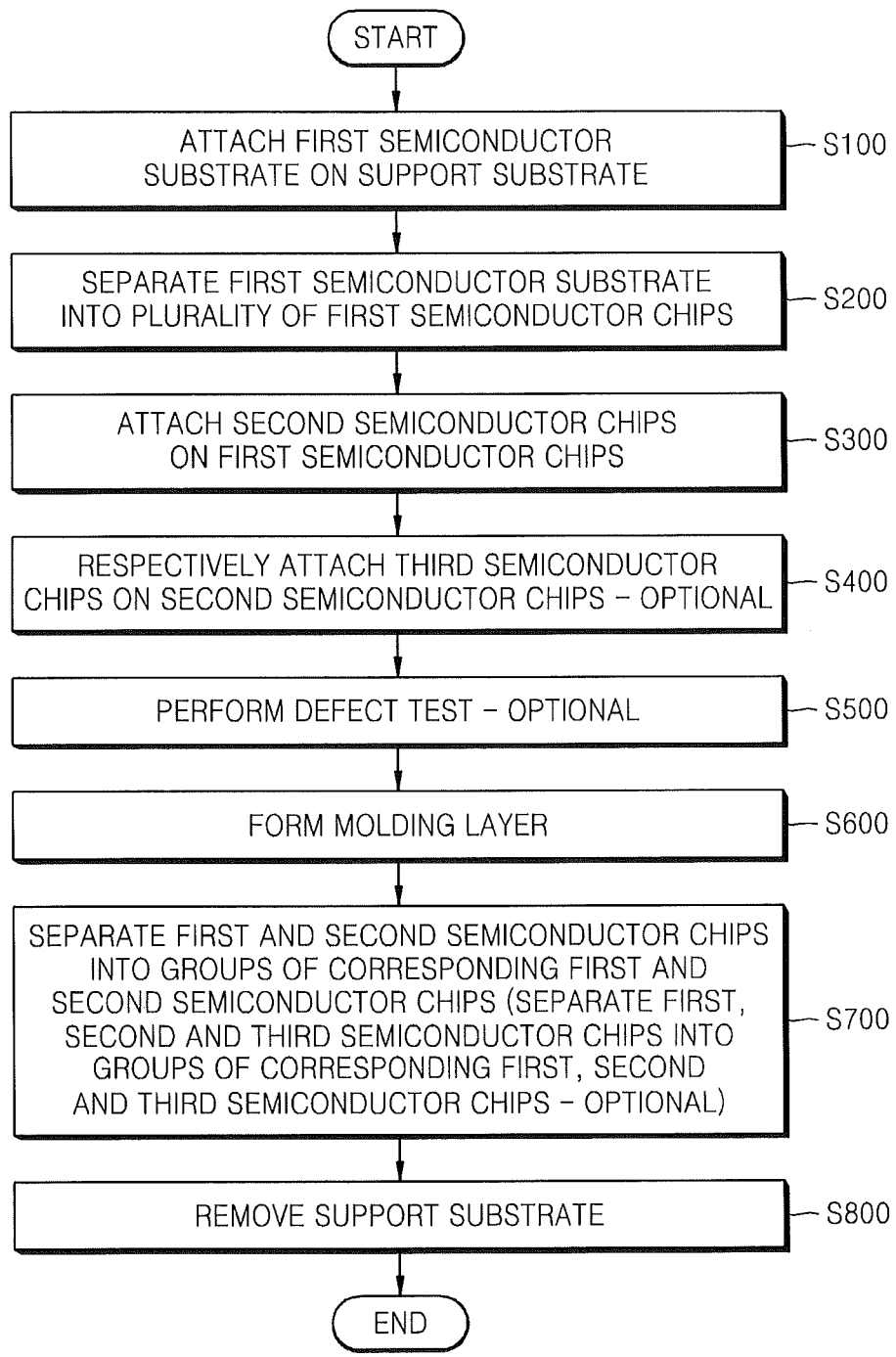
FIGS. 35 and 36 are flowcharts illustrating methods of manufacturing a semiconductor package, according to embodiments of the inventive concept.

FIG. 35 is a flowchart illustrating a method of manufacturing semiconductor packages 1a, 1b, 1f, or 1g according to the embodiments described above with reference to FIGS. 8 through 17, FIGS. 8 through 17, FIGS. 24 through 31, or FIGS. 32 through 34.

Referring to FIG. 35 and FIG. 11 or FIG. 12, the first preliminary substrate 100 or the first semiconductor substrate 100a is attached on the support substrate 10 using the adhesive layer 20, in operation S100. The first preliminary substrate 100 or the first semiconductor substrate 100a includes a plurality of first semiconductor chips C1. The first preliminary semiconductor substrate 100 may be attached on the support substrate 10 before a back-lap process is performed. Alternatively, the first semiconductor substrate 100a may be attached on the support substrate 10 after the back-lap process is performed. Referring to FIG. 35 with FIG. 15, 27 or 33, the first semiconductor substrate 100a is separated into a plurality of first semiconductor chips C1 in operation S200.

Referring to FIG. 35 and FIG. 14, 28, or 34, second semiconductor chips C2 that respectively correspond to the first semiconductor chips C1 are attached on the first semiconductor chips C1, respectively. When forming a semiconductor package including three semiconductor chips, for example, referring to FIG. 35 and FIG. 15 or 29, third semiconductor chips C3 are attached on the second semiconductor chips C2, in operation S400. Thus, the corresponding second semiconductor chips C2 or second and third semiconductor chips C2 and C3 are stacked on the first semiconductor chips C1, respectively. When four or more semiconductor chips are to be stacked, this operation may be repeated.

In operation S500, a defect test may be selectively performed with respect to the stacked first and second semiconductor chips C1 and C2 or the first through third semiconductor chips C1, C2, and C3, Here, the defect test may be performed via the third through electrode 120b exposed on the third semiconductor chip C3. The defect test may be performed after attaching the first semiconductor substrate 100a on the support substrate 10, after separating the first semiconductor substrate 100a into the first semiconductor chips C1, or after attaching the second semiconductor chips C2 on the first semiconductor chips C1.

Referring to FIG. 35 and FIG. 16, 18, or 30, a molding layer 80 is formed in operation S600. The molding layer 80 may cover the first through third semiconductor chips C1, C2, and C3. However, according to some embodiments, an upper surface of the uppermost semiconductor chip (e.g., the third semiconductor chip C3) may not be covered by the molding layer 80.

Referring to FIG. 35 and FIG. 17, 19, or 31, a portion of the molding layer 80 is removed to separate the first and second semiconductor chips C1 and C2 into groups of corresponding first through and second semiconductor chips C1 and C2 or separate the first and second semiconductor chips C1 and C2 into groups of first through third semiconductor chips C1, C2, and C3.

Referring to FIG. 35 and FIG. 1A, 2, 6, or 7, the above-described support substrate 10 is removed with the adhesive layer 20 to form the semiconductor package 1a, 1b, 1f, or 1g in operation S800.

Figure 36:
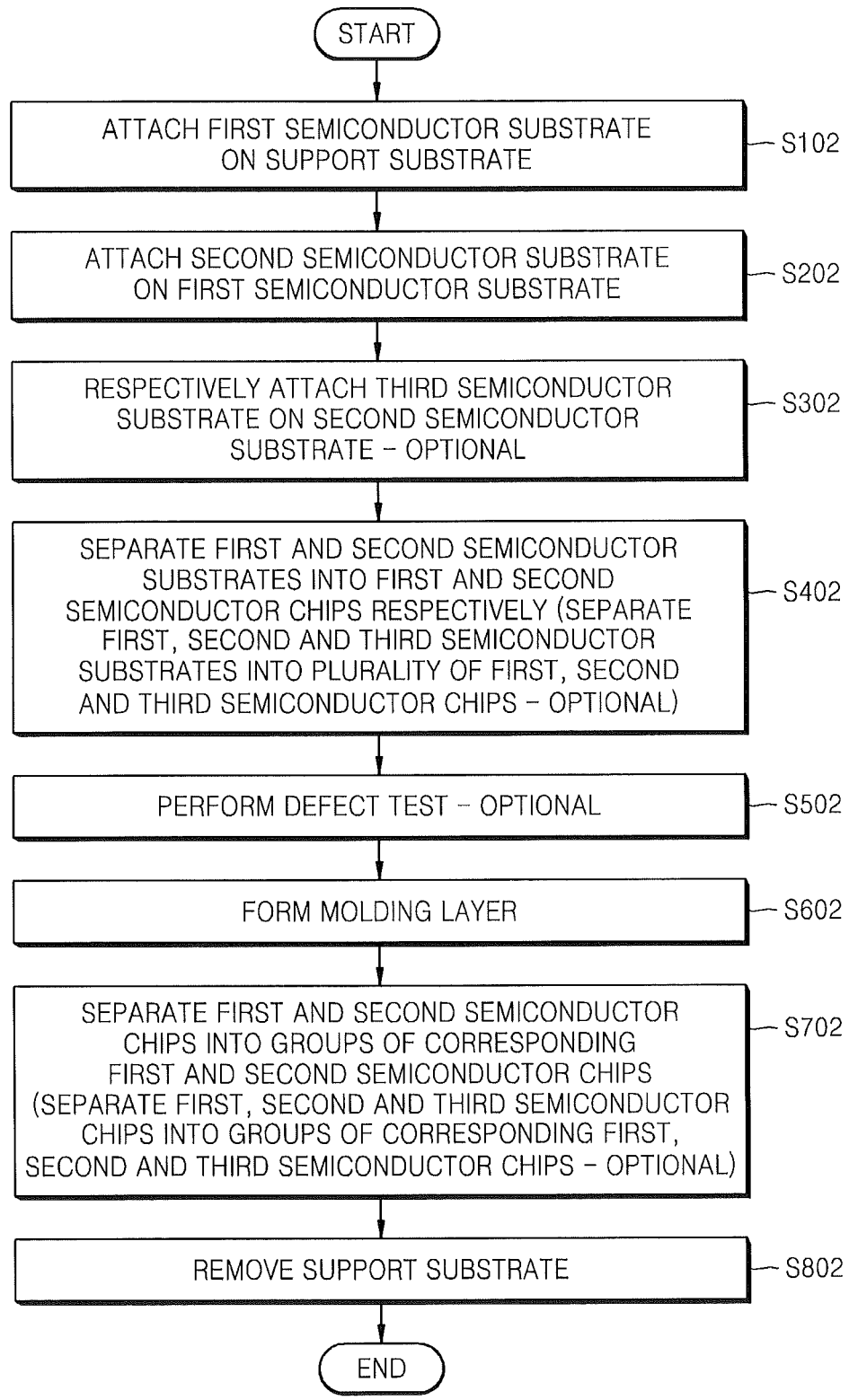

FIG. 36 is a flowchart illustrating a method of manufacturing semiconductor packages 1c or 1d according to the embodiments described above with reference to FIGS. 20 through 24 or FIGS. 25 to 26.

Referring to FIG. 36 and FIG. 11 or 12, the first preliminary semiconductor substrate 100 or the first semiconductor substrate 100a is attached on the support substrate 10 using the adhesive layer 20, in operation S102. The first preliminary semiconductor substrate 100 or the first semiconductor substrate 100a includes a plurality of first semiconductor chips C1. The first preliminary semiconductor substrate 100 may be attached on the support substrate 10 before a back-lap process is performed. Alternatively, the first semiconductor substrate 100a may be attached on the support substrate 10 after the back-lap process is performed.

Referring to FIG. 36 and FIG. 20, the second semiconductor substrate 200a is attached on the first semiconductor substrate 100a, in operation S202. The second semiconductor substrate 200a includes a plurality of second semiconductor chips C2.

When forming a semiconductor package including three semiconductor chips, for example, referring to FIG. 36 and FIG. 21, the third semiconductor substrate 200a is attached on the second semiconductor substrate 200a, in operation S302. When four or more semiconductor chips are to be stacked, this operation may be repeated.

Referring to FIG. 36 and FIG. 22, the first and second semiconductor substrates 100a and 200a or the first through third semiconductor substrates 100a, 200a, and 300a are separated into first and second semiconductor chips C1 and C2 or first through third semiconductor chips C1, C2, and C3, respectively, in operation S402. Thus, the corresponding second semiconductor chips C2 or the second and third semiconductor chips C2 and C3 are stacked on the first semiconductor chips C1, respectively.

After separating the first semiconductor chips C1, a defect test may be selectively performed on the stacked first and second semiconductor chips C1 and C2 or the first through third semiconductor chips C1, C2, and C3, in operation S502. Here, the defect test may be performed via the third through electrode 120b exposed on the third semiconductor chip C3. The defect test may be performed after attaching the first semiconductor substrate 100a on the support substrate 10 or after attaching the second semiconductor chips C2 on the first semiconductor chips C1.

Referring to FIG. 36 and FIG. 23 or 25, a molding layer 80 is formed in operation S602. The molding layer 80 may cover the first through third semiconductor chips C1, C2, and C3. However, according to some embodiments, an upper surface of the uppermost semiconductor chip (e.g., the third semiconductor chip C3) may not be covered by the molding layer 80.

Referring to FIG. 36 and FIG. 24 or 26, a portion of the molding layer 80 is removed to separate the first and second semiconductor chips C1 and C2 or the first through third semiconductor chips C1, C2, and C3 into groups of corresponding first and second semiconductor chips C1 and C2 or into groups of corresponding first through third semiconductor chips C1, C2, and C3.

Referring to FIG. 36 and FIG. 3 or 4, the above-described support substrate 10 is removed with the adhesive layer 20 to form the semiconductor package 1c or 1d, in operation S802.

Figure 37:
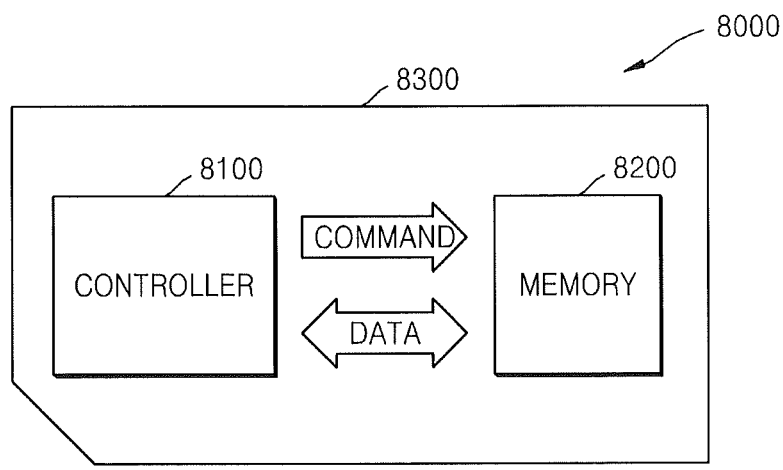
FIG. 37 is a schematic view illustrating a memory card according to an embodiment of the inventive concept.

FIG. 37 is a schematic view illustrating a memory card 8000 including a semiconductor device, according to an embodiment of the inventive concept.

The memory card 8000 may be disposed such that a controller 8100 and a memory 8200 exchange electrical signals with each other. For example, when the controller 8100 sends a command, the memory 8200 may transmit data.

The memory 8200 may include the semiconductor devices according to the embodiments of the inventive concept. Also, the memory 8200 may include at least one of the semiconductor devices described with reference to FIGS. 1A through 7.

The memory card 8000 may be any of various memory cards, such as a memory stick card, a smart media card (SM), a secure digital card (SD), a mini-secure digital card (mini SD), or a multimedia card (MMC).

According to the semiconductor package of the embodiments of the inventive concept, an increase in the volume of the semiconductor package is reduced or minimized even when stacking memory chips or controller chips together. Thus, a high capacity or high performance memory card 8000 may be manufactured using the semiconductor package according to the embodiments of the inventive concept.

Figure 38:
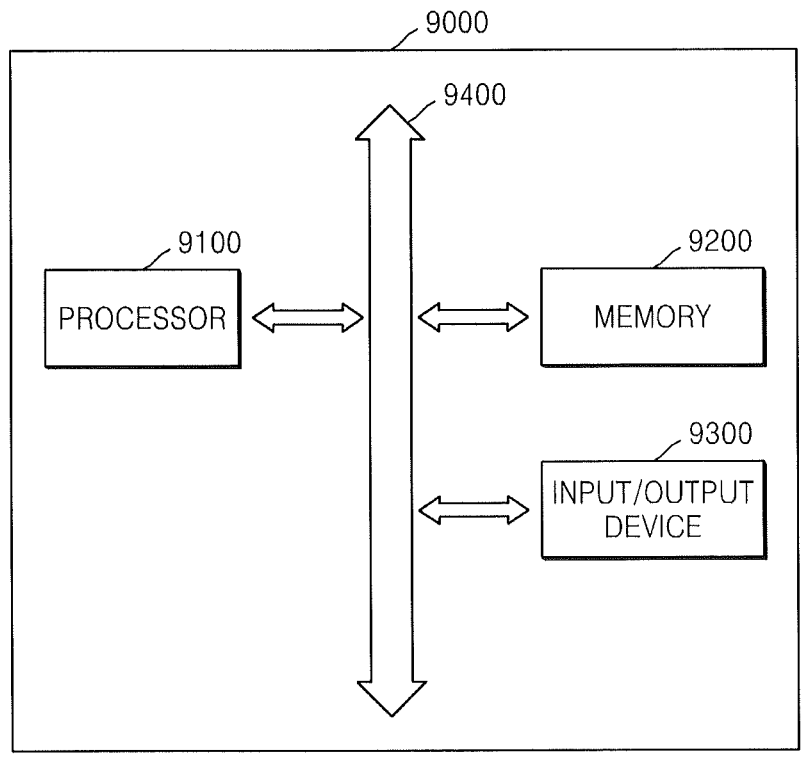
FIG. 38 is a schematic view illustrating an electronic system according to an embodiment of the inventive concept.

FIG. 38 is a schematic view illustrating an electronic system 9000 including a semiconductor device, according to an embodiment of the inventive concept.

Referring to FIG. 38, the electronic system 9000 may include a processor 9100, an input/output device 9300, and a memory 9200 which may perform data communications with one another via a bus 9400. The processor 9100 may execute programs and control the electronic system 9000. The input/output device 9300 may be used for inputting or outputting data of the electronic system 9000. The electronic system 9000 may be connected to an external device, such as a personal computer or a network, using the input/output device 9300 to exchange data with the external device. The memory 9200 may store codes and data for operating the processor 9100. For example, the memory 9200 may be the semiconductor package 1a, 1b, 1c, 1d, 1e, 1f, or 1g described with reference to FIGS. 1A through 7.

The memory 9200 may include the semiconductor devices according to the embodiments of the inventive concept. Also, the memory 9200 may include at least one of semiconductor devices described with reference to FIGS. 1A through 7. The memory 9200 may store codes and data for operating the processor 9100.

The electronic system 9000 may be used in manufacturing various electronic control devices that require the memory 9200, and may be used, for example, in mobile phones, MP3 players, navigation devices, solid state disks (SSD), or household appliances.

According to a semiconductor package of the embodiments of the inventive concept, an increase in the volume of the semiconductor package is reduced or minimized even when stacking memory chips or controller chips together. Thus, a high capacity or high performance electronic system 9000 may be manufactured using the semiconductor package according to the embodiments of the inventive concept.

While the inventive concept has been particularly shown and described with reference to exemplary embodiments thereof, it will be understood that various changes in form and details may be made therein without departing from the spirit and scope of the following claims.

That which is claimed:

1. A method of manufacturing a semiconductor package, the method comprising:
    attaching a semiconductor substrate on a support substrate using an adhesive layer, wherein the semiconductor substrate comprises a plurality of first semiconductor chips and a chip cutting region, wherein first and second ones of the plurality of first semiconductor chips are separated from each other by the chip cutting region, and the semiconductor substrate includes a first surface on which an active area is formed and a second surface opposite to the first surface;
    forming a first cutting groove having a first kerf width in the chip cutting region between the first and second ones of the plurality of first semiconductor chips, so that the semiconductor substrate is separated into a plurality of first semiconductor chips;
    attaching a plurality of second semiconductor chips corresponding to the first semiconductor chips, respectively, to the plurality of first semiconductor chips;
    forming a molding layer so as to fill the first cutting groove; and
    forming a second cutting groove having a second kerf width that is less than the first kerf width, in the molding layer, so as to separate the molding layer into individual molding layers covering one of the plurality of first semiconductor chips and corresponding one of the plurality of second semiconductor chips.

2. The method of claim 1, wherein the forming of the first cutting groove comprises removing a portion of the chip cutting region and a portion of the adhesive layer.

3. The method of claim 2, wherein in the forming of the second cutting groove, a portion of the molding layer, which is formed where a portion of the adhesive is removed, is separated by the second cutting groove so as to form a protrusion protruding with respect to the first surface of the semiconductor substrate facing the support substrate.

4. The method of claim 1, wherein the plurality of first semiconductor chips comprise a plurality of first through electrodes, respectively.

5. The method of claim 4, wherein in the attaching of the semiconductor substrate on the support substrate on which the adhesive layer is formed, the first surface of the semiconductor substrate is formed to contact the adhesive layer.

6. The method of claim 5, further comprising, after attaching the semiconductor substrate on the support substrate, exposing the plurality of first through electrodes by removing a portion of the semiconductor substrate from the second surface of the semiconductor substrate.

7. The method of claim 4, wherein the plurality of first semiconductor chips further comprise a plurality of first connection bumps that are respectively electrically connected to the plurality of first through electrodes, and
    wherein the attaching of the semiconductor substrate on the support substrate, on which the adhesive layer is formed, comprises forming the plurality of first connection bumps so as to be surrounded by the adhesive layer.

8. The method of claim 7, wherein a semiconductor device formed in the second semiconductor chips is electrically connected to at least some of the plurality of first connection bumps via at least some of the plurality of first through electrodes.

9. The method of claim 8, wherein the second semiconductor chips further comprise a plurality of second connection bumps respectively corresponding to at least some of the plurality of first through electrodes, and
    in the attaching of the second semiconductor chips, the plurality of second connection bumps are formed to contact the corresponding first through electrodes.

10. The method of claim 7, wherein the plurality of first connection bumps are attached on the first surface of the first semiconductor chips.

11. The method of claim 7, wherein the plurality of first connection bumps are attached on the second surface of the first semiconductor chips.

12. The method of claim 11, wherein the plurality of first through electrodes electrically connect a semiconductor device formed in the first semiconductor chip or the second semiconductor chip to the plurality of first connection bumps.

13. The method of claim 7, wherein thicknesses of the plurality of first connection bumps are less than a thickness of the adhesive layer.

14. The method of claim 13, wherein a depth of a removed portion of the adhesive layer in the first cutting groove is less than a thickness of the first connection bumps.

15. The method of claim 1, wherein the forming of the molding layer comprises completely covering the plurality of first and second semiconductor chips using the molding layer.

16. The method of claim 15, wherein the forming of the molding layer comprises completely surrounding the plurality of second semiconductor chips using the molding layer.

17. The method of claim 1, further comprising, before the forming of the molding layer, performing a test for the first semiconductor chips and the second semiconductor chips corresponding to the first semiconductor chips.

18. The method of claim 1, wherein in the attaching of the semiconductor substrate on the support substrate, on which the adhesive layer is formed, the second surface is formed to contact the adhesive layer.

19. The method of claim 1, wherein in the forming of the second cutting groove, a remaining portion of the molding layer after forming the second cutting groove is formed to completely cover sidewalls of the first cutting groove.

20. The method of claim 1, wherein in the forming of the second cutting groove, the second cutting groove is formed passing through the molding layer.

21. The method of claim 1, wherein the plurality of second semiconductor chips are attached to the first semiconductor chips.

22. The method of claim 21, wherein at least some of the plurality of second semiconductor chips include a plurality of second through electrodes.

23. A method of manufacturing a semiconductor package, the method comprising:
- attaching a first semiconductor substrate onto a support substrate using an adhesive layer, wherein the first semiconductor substrate comprises a plurality of first semiconductor chips and a first chip cutting region, wherein first and second ones of the plurality of first semiconductor chips are separated from each other by the first chip cutting region, wherein the plurality of first semiconductor chips respectively including a plurality of first through electrodes;
- attaching a second semiconductor substrate on the first semiconductor substrate, wherein the second semiconductor substrate comprises a plurality of second semiconductor chips and a second chip cutting region, wherein first and second ones of the plurality of second semiconductor chips are separated from each other by the second chip cutting region, wherein the plurality of second semiconductor chips respectively include a plurality of second through electrodes;
- forming a first cutting groove having a first kerf width, in the first chip cutting region of the first semiconductor substrate and in the second chip cutting region of the second semiconductor substrate so as to respectively separate the first and second semiconductor substrates into the first and second semiconductor chips;
- forming a molding layer to fill the first cutting groove; and
- forming a second cutting groove having a second kerf width that is less than the first kerf width, in the molding layer, so as to separate the molding layer into individual molding layers covering one of the plurality of first semiconductor chips and a corresponding one of the plurality of second semiconductor chips.

24. The method of claim 23, wherein in the forming of the first cutting groove, a portion of the first chip cutting region, a portion of the second chip cutting region, and a portion of the adhesive layer are removed together.

25. The method of claim 23, further comprising, after the forming of the second cutting groove, separating the adhesive layer and the support substrate from the plurality of first semiconductor chips.

26. The method of claim 23, wherein the first semiconductor chips and the second semiconductor chips are homogeneous semiconductor chips.

* * * * *